US009923108B2

(12) United States Patent
La Due

(10) Patent No.: US 9,923,108 B2
(45) Date of Patent: Mar. 20, 2018

(54) SOLAR POWER GENERATION METHOD AND APPARATUS

(75) Inventor: Christoph Karl La Due, Talent, OR (US)

(73) Assignee: Neotec Energy Pty, Ltd. (AU)

(*) Notice: Subject to any disclaimer, the term of this patent is extended or adjusted under 35 U.S.C. 154(b) by 868 days.

(21) Appl. No.: 14/255,796

(22) PCT Filed: Nov. 15, 2011

(86) PCT No.: PCT/US2011/060865
§ 371 (c)(1),
(2), (4) Date: Oct. 28, 2014

(87) PCT Pub. No.: WO2013/058780
PCT Pub. Date: Apr. 25, 2013

(65) Prior Publication Data
US 2015/0040963 A1 Feb. 12, 2015

Related U.S. Application Data

(60) Provisional application No. 61/547,944, filed on Oct. 17, 2011.

(51) Int. Cl.
*H01L 31/042* (2014.01)
*H02S 20/00* (2014.01)
(Continued)

(52) U.S. Cl.
CPC ...... *H01L 31/0422* (2013.01); *H01L 31/0543* (2014.12); *H02J 7/355* (2013.01);
(Continued)

(58) Field of Classification Search
CPC ....... H01L 31/00; H01L 31/02; H01L 31/024; H01L 31/04; H01L 31/052; H01L 31/053;
(Continued)

(56) References Cited

U.S. PATENT DOCUMENTS 3,296,469 A * 1/1967 Hall ................... H02K 99/20
310/306
4,634,343 A 1/1987 Nakamats
(Continued)

OTHER PUBLICATIONS

International Search Report and Written Opinion for International Patent Application No. PCT/US2011/060865, dated Oct. 8, 2012, 9 pages.
(Continued)

Primary Examiner — Christina Chern
(74) Attorney, Agent, or Firm — Elliott, Ostrander & Preston, P.C.

(57) ABSTRACT

A solar power generation apparatus includes a stationary horizontal base. A stator is housed in the base, and a vertical column extends upward from the base. A conical-shaped rotor is rotatingly coupled at its apex to the column, while its base is near the stator. The rotor comprises an array of photovoltaic cells positioned on a surface of the rotor, wherein each cell converts light energy received from a light source to a direct current voltage, and an array of magnets positioned at a perimeter of the base of the rotor, wherein the magnets are electrically coupled to and receive direct current voltage from a respective cell. The rotating of the rotor past the stator converts the direct current voltage present at the array of magnets into an alternating current voltage.

9 Claims, 11 Drawing Sheets

(51) Int. Cl.
          *H02J 7/35*       (2006.01)
          *H02P 9/04*       (2006.01)
          *H02K 47/02*      (2006.01)
          *H02K 7/18*       (2006.01)
          *H01L 31/054*     (2014.01)
          *H02K 99/00*      (2014.01)

(52) U.S. Cl.
     CPC ........... *H02K 7/1807* (2013.01); *H02K 47/02* (2013.01); *H02K 99/10* (2016.11); *H02P 9/04* (2013.01); *H02S 20/00* (2013.01); *Y02E 10/52* (2013.01)

(58) Field of Classification Search
     CPC ...... H02K 99/10; H02K 47/02; H02K 7/1807; H02S 20/00
     See application file for complete search history.

(56)                References Cited

U.S. PATENT DOCUMENTS 5,731,676 A       3/1998   Nakamats
     2010/0139735 A1   6/2010   Anderson

OTHER PUBLICATIONS

International Preliminary Report on Patentability and Written Opinion for International Patent Application No. PCT/US2011/060865, dated May 1, 2014, 6 pages.

\* cited by examiner

SOLAR POWER GENERATION METHOD AND APPARATUS

PRIORITY

This U.S. patent application claims priority to U.S. International Patent Application No. PCT/US11/60865 filed Nov. 15, 2011, which claims priority to U.S. Provisional Patent application No. 61/547,944 filed Oct. 17, 2011.

BACKGROUND OF THE INVENTION

Field of the Invention

Embodiments of the invention provide the first solar photoelectric generation system that fully uses a three dimensional (3D) spin-effect to enable complete omni directional tracking of the Sun from horizon-to-horizon, as the Sun tracks across a curved azimuth regardless of the time of Solar year. Embodiments of the invention represent the first dynamic solar photovoltaic electrical power generation system in the history of solar photovoltaic technology development and advancement. An embodiment of the invention relates directly to photovoltaic cells that generate electrical voltage from solar power during a continued spin state. However, all prior art photovoltaic technology is based upon conventional non-dynamic electrical voltage principles. Embodiments of the invention enable independent and dynamic production of energy by each photovoltaic cell that is mounted on a Spin 3D photovoltaic surface.

Description of Related Art

In 1839 Alexandra Edmond Becquerel observed the photovoltaic effect via an electrode in a conductive solution exposed to sunlight. This early exploration began the drive towards harnessing Sunlight for the purpose of generating electrical energy. In 1954 Bell Labs announced the invention of the first modern silicon solar cell. These early solar voltaic cells had about six percent efficiency. In 2008, scientists at the U.S. Department of Energy's National Renewable Energy Laboratory set a world record in solar cell efficiency with a photovoltaic device that converts 40.8 percent of Sunlight that hits the surface of a photovoltaic cell into electricity.

However, while these advances are significant, current solar voltaic technology still faces many problems. Embodiments of the invention solve many of the problems that impede the advancement of efficient and cost effective solar power systems. Embodiments of the invention make possible a minimum output increase of four times the electrical power of any conventional photovoltaic structure, because it can utilize any available photovoltaic material without the need for modifying the material so specified in terms of design and manufacture form factors.

Today, materials used for photovoltaics include monocrystalline silicon, polycrystalline silicon, amorphous silicon, cadmium telluride, and copper indium selenide-sulfide. Embodiments of the invention are designed to use one or a plurality of available photovoltaic materials. The embodiments fully exploit new developments in transparent photovoltaic materials. Recent developments in thin-film photovoltaics have led to increased physical flexibility of the material. However the invention can utilize any photovoltaic material. Embodiments of the invention represent a revolution in the full utilization of three dimensional (3D) spin effect for the realization of electrical voltage production from the spinning Sun.

SUMMARY OF THE INVENTION

Embodiments of the invention introduce a new dynamic photovoltaic spin cell surface form factor. These photovoltaic structures are designed to spin on a low drag set of bearings. The spin of each photovoltaic cone solves the problem of Sun movement affecting electrical output during a Solar day. No matter which position the Sun is in during the day, the invention's photovoltaic panels are in full view of all propagating Sunlight and receive the full impact of light and heat energy. The embodiments provide direct DC to AC conversion without the need for conventional voltage inversion. Embodiments provide heat dispersion due to the essential spin of each layered cone that resides in multiple conical sections. Embodiments of the invention are designed to be totally scalable from large macro sizes to the nano scale. Each spin cell can be a standalone electrical voltage generator or can be linked physically and logically to a multiple array or a plurality of Spin 3D photovoltaic generators in order to supply higher wattage to any associated electrical grid and/or storage device.

Embodiments of the invention can be used to power small off-grid power systems that need direct current (DC) only, for example, computer laptops, mobile cellular phones, and the like, or used for large regional and national grid implementations that require alternating current (AC) generation. This fundamental construct is supported by basic Cartesian logic: (1) Due to spin, a cone or other geometric surface has the same sun exposure as a flat array with the same PV surface area at any given or arbitrary time bound. Because of spin it is always fully exposed, enabling full peak angle power when each trigonal photovoltaic segment is exposed during its rotational cycle.

According to one embodiment of the invention, the exposure to the Sun of available photovoltaic material is the same when compared to a static flat photovoltaic apparatus of equal area, and with much less physical footprint for a given area. (2) The cone or other surface area is never half exposed to the Sun because of essential spin. (3) Because of dynamic spin, embodiments of the invention glean the same coverage as a flat array. (4) In addition, the invention enables full optical peak collection angle, while the flat array does not. (5) The embodiments enable a cooling effect due to spin, the flat array does not. This feature alone produces more wattage per square centimeter of surface area because of dramatically lowering heat. Testing shows that the Spin 3D power generation system enables a significant drop in PV material surface temperature. In one test, surface temperature dropped 20 degrees Centigrade. These are the advantages. In addition, embodiments of the invention enable independent and dynamic production of electrical voltage from each photovoltaic cell that is mounted in offset segments on each Spin 3D photovoltaic cone-rotor surface. An embodiment of the invention is that selected photovoltaic shapes spin while generating electrical voltage independently. An embodiment of the invention introduces a plurality of geometric shapes for the design of photovoltaic cell surface form factors. Electrons flow from the top of the selected Spin 3D power generation system shape to the bottom of the skirt that is populated by a plurality of charged polarized magnets. In one embodiment, the invention requires a minimum of two magnets per each trigonal shaped PV segment. The outer surface and in some application specific cases the inner photovoltaic surfaces produce an exponential increase in voltage without the need for increasing installed apparatus footprint.

DETAILED DESCRIPTION OF EMBODIMENTS OF THE INVENTION

Figure 1:
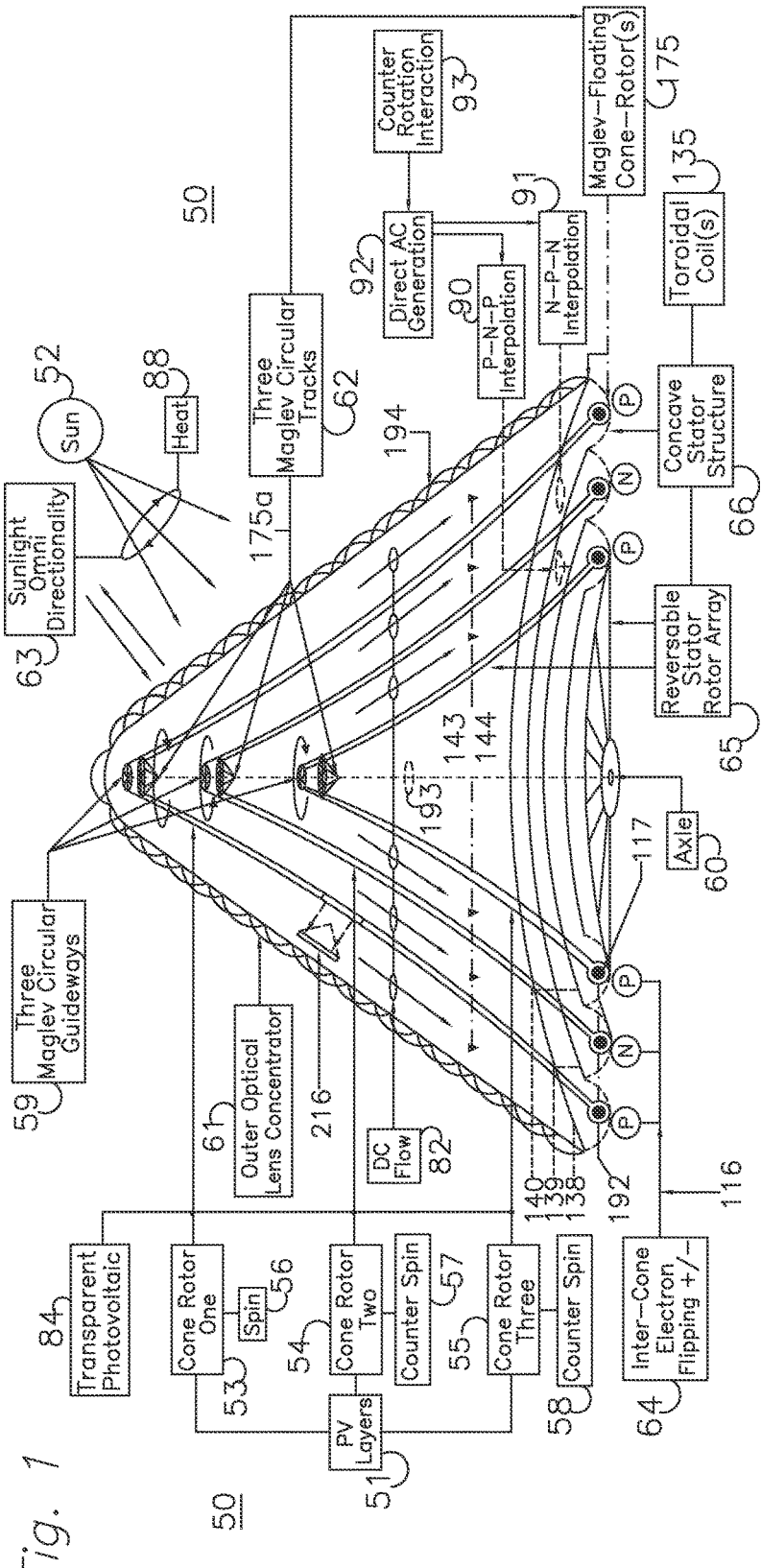
FIG. 1 depicts the component parts of the Spin 3D photovoltaic cone-rotor surface with multiple layered hierarchal-scaled photovoltaic cone-rotor(s) according to one embodiment of the invention.

The photovoltaic effect produces direct current (DC). Attached to the bottom edge of the photovoltaic spin surface are embedded small electrically charged polarized magnets. This electrical charge originates from the direct current (DC) that is produced by the photovoltaic material. In this case, the photovoltaic surface is a rotating-cone-rotor not unlike a rotor that resides and spins within the coiled stator of an electrical motor or generator. This dynamic apparatus combination acts as an AC power generator in one embodiment. An embodiment of the invention is that there is provided a specialized concentric stator. Embodied in the stator are concentric arrays of embedded magnets that are interconnected via a coiled array.

As the spin surface turns in clockwise and/or counterclockwise direction, the skirt magnets rotate and pass over the coiled magnets that reside as parts of specialized coil arrays within a circular base. This spin effect directly produces alternating current (AC) without the need for inefficient direct current-to-alternating current inversion. This automatic polarized field effect is due to the magnetic coupling transform. This electro-magnetic transform is also known as the Tesla switching effect.

This core embodiment produces AC current with very little loss, thus exponentially increasing electrical power output as a result of close tolerance spinning photovoltaic surfaces. An embodiment of the invention is that there are provided multiple photovoltaic surfaces which reside within each other in a nesting "Russian Doll" or hierarchical scale array style. An embodiment of the invention is that one or a plurality of photovoltaic surfaces ride on low friction floating needle bearings that are magnetically lifted in accord with magnetic levitation (maglev) well known to those who practice the arts.

An embodiment of the invention introduces true omni-directionality for the first time in the development history of Sun powered photovoltaic systems. This feature solves the problem of the Sun angle limitations of flat stationary photovoltaic panel arrays. An embodiment of the invention is that due to the spin effect of each photovoltaic cone, directional convection cooling is induced. In one embodiment, the invention's spin effect enables an exponential increase in electrical output due to the described electro-dynamic action as each photovoltaic surface passes in close physical proximity to each other.

In one embodiment of the invention, there are provided Fresnel lenses and Fresnel ribbing that magnify and transmit both light and heat to the outer and inner photovoltaic spin surfaces simultaneously. The embodiment can apply legacy materials and manufacturing methods and still produce high efficiency output per square meter of photovoltaic surface, when compared to conventional flat panel solar technology. Multiple photovoltaic surfaces are provided that exponentially increase electrical output without increasing physical mounted footprint such as in the common example of flat panel photovoltaic arrays.

Embodiments of the invention are also designed to be produced with photovoltaic cell structures that possess optical transparency or near-transparency. This material can convert windows and other physical surfaces into solar generating panels. The current efficiency of prototype cells is low. But by stacking cone-rotors, electrical voltage output efficiency can be dramatically increased. In one embodiment, these advanced transparent materials can be coated on the invention's smooth and transparent photovoltaic surfaces in the form of trigonal segments that will spin freely at very close tolerances due to magnetic lift. In addition, transparent electrical voltage conductors can be easily coated on the embodiment's transparent spin cone-rotor photovoltaic surfaces such as the Fresnel or optical concentrator material making up the trigonal-web-lattice structure that comprises each cone-rotor array Injection molded acrylic polymer is an excellent medium for the manufacture of the geometric structures that spin in close tolerances with each other in a counter rotating manner in order to produce an additional electrical voltage producing field effect. In still another embodiment, the invention's spin cone-rotor photovoltaic surfaces can spin in the same clockwise and counter clockwise direction but at different revolution rates in order to enable this electro-magnetic field effect. This feature is fully illustrated and specified in the embodied drawings that are included in this disclosure.

Embodiments of the invention utilize a simple yet effective electro-magnetic transform. This transform converts polarized magnetism and produces voltage due to a simple electro-mechanical switching process. This simple switching transform takes North-South polarity which is passive direct current (DC) and produces alternating current (AC) from a simple rotating effect. This simple but effective transform was discovered by Hippolyte Pixii when he built the first alternator in 1832. When Pixii hand cranked a common U-shaped North-South magnet with opposing points, the physical North and South rotating poles of the magnet produced alternating current (AC) in two stationary coils that were placed at the top and wired to a voltage load output. The embodiment's cone-rotors spin incrementally charged electro-magnets. These electro-magnets are comprised of segments that spin within the circular structure of a segmented coiled stator. These coiled segments form magnetically charged North and South magnets, which simply equate to a negative and positive charge. This feature set is powered by the direct current output that is generated by the photovoltaic cell material that covers the surface of each spinning cone.

Photovoltaic material known in the art today is designed and manufactured to provide many years of service. Embodiments of the invention exploit this fact. Each photovoltaic cell surface is water jet cut in a trigonal-triangular shape in order to maximally cover the conical shape of each of the cone-rotor form factors, according to an embodiment of the invention. This feature insures the best power output level attainable in terms of the embodiment's geometric structure. It provides the added feature that the photovoltaic material is always optimally positioned to collect the maximum amount of solar energy.

In one embodiment light concentration is provided by a transparent lens structure that is arrayed with concentric, stretched half-radian Fresnel lenses that are integral to the injection molded outer optical lens concentrator design. The embodiment uses the spin cone-rotor surfaces to maintain a consistent peak angle relative to the Sun. The embodiment maximizes capture of the energy produced from the Sun no matter what position it is in as it travels from horizon to horizon in the sky. Another way of describing this horizon-to-horizon effect is the distinct difference between the light and dark side of the Moon. Both Fresnel ribbing and geometrically shaped Fresnel lensing produce an exponential increase in light concentration. This is but one basic feature of the embodiment that is designed to increase electrical voltage power output. Heat from the Sun is also concentrated by the Fresnel effect, but the spin cone-rotor effect dramatically decreases the deleterious effects of this heat.

According to one embodiment of the invention, each photovoltaic spin surface counter-rotates relative to other spin surfaces in order to produce an electrical field effect. This field effect is produced because of a number of factors. The solar photovoltaic surface spins, altering how light is spread across the crystalline structure. This induces better electron flow. This field effect is produced by the scalar and planar interrelationship of related crystal particles according to an embodiment of the invention. In addition, the cumulative result of electromagnetic interaction between adjacent counter rotating photovoltaic spin surfaces adds dramatically to electron production from the same measured surface area.

An embodiment of the invention introduces rotational spin of photovoltaic material into the technological world of solar electrical power generation. The magnetic coupling transform, based on Tesla's principles, is utilized in an embodiment. Each trigonal section of the photovoltaic cone-rotor is interconnected by conductor means to dual electromagnets located at the bottom of the skirt of each photovoltaic cone-rotor. There is provided evenly distributed magnetic lift (maglev) magnets mounted on (1) the cone-rotor skirt and (2) and with each of the concave concentric tri-coils that comprise the stator(s). Charged electromagnets are distributed proportionately around the cone skirt. Each electromagnet is subject to having its polarity switched by the embodiment's circuitry means, which method propagates positive and negative fields like a rotor in a voltage generator. This method does not drain DC energy from the photovoltaic source. The voltage is simply transferred from each cone-rotor using the magnetic coupling effect. This feature is well known to those who practice the electrical arts. However, embodiments of the invention utilize this method in a complete novel way, for it is applied herein to make possible the direct generation of alternating current from solar or other light energy.

Embedded offset parameter coil segments are specially arranged in offset concentric concave tri-coils in the stator. The embodiment utilizes a proven magnetic coupling transform, using associated magnet and coil arrays arranged so that each scaled cone-rotor interacts with its associated concentric toroidal stator-coil array.

The invention utilizes a spinning cone-rotor and stationary concentric stator magnetic array. The cone-rotor and the associated concentric stator produce alternating current (AC) from the originating DC voltage that is produced by the photovoltaic cells comprising the rotating cone(s). The positive and negative DC photovoltaic voltage source in this case functions in the same way that North-South magnets do in a conventional stator used to create electron flow with a magnetic field. Conventional voltage producing generators use coiled magnets that are wired in uniform segments in both coiled stator and rotor designs well known to those who practice the art. The invention uses coil offsets in each concentric stator tri-coil in order to produce a scaled electromagnetic field. This is configured in order to produce alternating current (AC) efficiently and to maintain cone-rotor stability.

The invention utilizes specialized interconnected switching elements that maintain a selected AC frequency rate such as 50-60 Hz or other desired frequencies in order to synchronize with interconnected electrical power grids, interconnected electrical appliances, and instrumentality. The DC voltage source from each of the invention's trigonal PV sections serves the same function as a magnetic array that produces North-South polarity in conventional electrical generators and motors. The invention's photovoltaic cone-rotor skirt magnets interact electrically with corresponding stator magnetic coil field-segments. These segments are physically arrayed and interconnected with the invention's specialized multi-race concentric stator wiring topology. The stators are structured as concave structures in order to maintain a level of isolation between concentric stators. In addition, this design enables a high degree of stability for the magnetic float lifting means provided for each suspended cone-rotor. This relationship between each cone-rotor and its associated graduated concentric stator enables each cone-rotor to spin as the voltage from the photovoltaic leads travels from top-down to each cone-rotor skirt base. Each skirt base is populated with evenly spaced electromagnets that are charged and transmit energy that has been generated directly from the sun. The invention is designated as a Spin 3D power generation system for descriptive purposes throughout this invention's disclosure.

Another embodiment of the embodiment illustrates the generation of alternating current (AC) simply from the electro-magnetic interaction of photovoltaic cone-rotor surfaces. Each trigonal photovoltaic cell propagates DC power to each of its associated skirt electromagnets. Each electrically-charged skirt magnet is driven to propel the cone-rotor in a clockwise or counter clockwise rotational pattern by means of an accurately switched magnetic coupling transform provided by the invention's unique integrated circuit (IC) topology. The physical interaction of counter-rotating cone-rotor photovoltaic surfaces produces electron flow that is sequenced as positively charged and negatively charged due to offset parameter switching. This is an efficient commutator effect that does not require overly complex switching matrixes or expensive electronic components that are subject to failure in time.

Positive and negative polarized voltage flows into magnetically charged skirt electromagnets residing at the bottom of each photovoltaic cone. These magnetized skirts are populated with evenly spaced magnets that are charged by direct interaction with the cone rotor(s) photovoltaic conductors that connect to each trigonal photovoltaic cell. These trigonal cells are comprised of conventional photovoltaic materials such as monocrystalline silicon, polycrystalline silicon, amorphous silicon, cadmium telluride, or copper indium selenide-sulfide. Another embodiment of the invention utilizes transparent thin film, organically grown as shaped as the conventional square shaped photovoltaic cell, or as trigonal photovoltaic material. Photovoltaic material can be supplied as a painted or dyed application on transparent trigonal shaped material, etched aluminum material, and the like.

Each conical photovoltaic cone-rotor is designed as a precision-tolerance assembly. Each of the hierarchical scaled cone-rotor(s) are manufactured and assembled so that each cone-rotor maintains a precisely spaced relationship to each other counter rotating cone-rotor. The close spatial-physical relationship between each cone-rotor and its neighbors contributes to more efficient voltage output. A closer relative spatial gap between spinning cones provides higher yield of electrical voltage and wattage due to the dynamic field effect. This same foundational effect occurs within contemporary efficient electrical generators and motors. The closer the proximity of rotors in relationship to associated stators, the more efficient will be the electrical power output of a generator. In like manner, electro-mechanical torque production in an electrical motor will be improved.

Another feature of embodiments of the invention is that one or a plurality of cone-rotors with associated magnetized skirts provides direct DC voltage to multiple magnetized concentric stator coils. Dynamic interpolated geometric patterns provide the unlimited potential of multiphase electrical energy generation. In fact this feature set introduces the availability of, for example, 100 or more electrical phases of energy generation for any electrical grid, and associated electrically powered apparatus.

This associated cone-rotor spin produces a form of electron positive-negative voltage commutation flip effect that occurs between counter-rotating surfaces. This electro-mechanical process produces more alternating current (AC) energy in addition to the embodiment's magnetic coupling transform, which is the disclosed Hippolyte Pixii effect.

The physical form factor of the cone-rotor shape, coupled with the angle of its surfaces, increases the amount of captured solar irradiance for much longer periods of a solar day, according to one embodiment of the invention. The rotation of the crystalline structure of the photovoltaic substrates will always take maximum advantage of the angle of Sunlight incident beam. The cone-rotor shaped photovoltaic surfaces can be comprised of monocrystalline silicon, polycrystalline silicon, amorphous silicon, cadmium telluride, copper indium selenide-sulfide or any other crystalline or metallic-crystalline combinations, including near transparent voltage producing photovoltaic film.

The conical Spin 3D power generation system can be facetted in fractalized trigonal sections in number of ways, according to one embodiment of the invention. Conventional mono- or polycrystalline silicon, amorphous silicon, cadmium telluride, copper indium selenide-sulfide or any other crystalline photovoltaic film that is used in solar power arrays can be water-jet cut in any desired shape. In this case a trigonal is most desired for a plurality of unique photoelectric effects. These photovoltaic shapes can be fitted and fused in conical sections with a plurality of manufacturing techniques.

Nature directly speaks to gossamer structures with respect to flying insect wings. The design lends to wing lightness, great strength, and efficient heat dispersion. These characteristics contribute to why a bumble bee flies against all the aerodynamic odds. In addition, the gossamer structures lend well to interrelated optical fractalized facets that reflect and refract with each other. Nearly all vegetation in one form or the other is structured in fractalized facets. This physical and material gossamer structure can be utilized in both the spin generator optical lens and in any form of photovoltaic crystalline substrate, organically grown or otherwise. Again, a trigonal shape is preferred. This description is but one of a plurality of design implementations.

The following design and mechanical steps describe multiple embodiments of a low level prototypal version in order to illustrate a migration path to a high level design that enables incredible levels of electrical energy generation, and ease of manufacture and deployment, at a low cost to the user. The total design of the one embodiment of the invention functions to provide efficient and low cost electrical energy generation from the Sun or any incident light source, including cloudy day state bounds. The embodiment's Spin 3D power generation system is actually comprised of a plurality of conical photovoltaic sections that act as dynamic cone-rotors. Cone-rotors are overlaid over each other in an elegant nesting "Russian Doll" or hierarchical scale array style. The total Spin 3D power generation system design structure can support additional smaller scale cone-rotor photovoltaic cell sections with fully stabilized clearance for counter-rotational spin of each conical section. The layered photovoltaic cone-rotors spin around the physical axle that serves as the structure's vertical axis.

Each conical cone-rotor section is comprised of physically, electrically, and logical integrated circuits (IC), diodes, and capacitor arrays that are mounted at the bottom skirt of each cone-rotor. In one embodied iteration, off-the-shelf monocrystalline silicon is used as the photovoltaic material. In this descriptive case, an embodiment of the conical spin cell is mechanically suspended on a center axle or column that also acts as a graduated needle bearing, supporting the magnetically levitated skirt. The center axle is comprised of a strong, low-cost composite material that is non-conductive. The graduated needle bearing can support one standalone cone-rotor section at the top, and a plurality of slightly smaller scale conical cone-rotor sections below the apex of the top axel-needle bearing.

Each cone-rotor is extremely light in weight. This feature minimizes friction and deleterious drag on the overall system, complementing the embodied Maglev feature. Step one of the design implementation is a graduated physical needle bearing which can support slightly smaller scale conical spin cell sections on the next lower bearing race. In step two, the graduated needle bearing can support another slightly smaller scale conical spin cell on the next slightly lower float bearing race. In the next step of describing the design implementation, the graduated needle bearing axel is mounted on a sturdy composite non-conductive base. The rigidity of the axel and the base configuration maintains proper datum and augments the Maglev process. This part of the specification ensures that no wobble of the spinning cone-rotor sections occurs. These features ensure high efficiency of AC electrical power generation. In the next step of the embodiment's design specification, the entire multilayered cone-rotor and toroidal tri-coil structure is encased with a sealed conical shaped optical concentrator structure that uses specialized Fresnel lenses and the like.

The optical lens concentrator structure is comprised of low cost transparent materials such as injection molded acrylic polymers that are manufactured in one seamless form factor. The surface of the outer optical lens concentrators are embedded with Fresnel ribbing and/or half-hemispherical optical lens concentrators that direct any light source to the spinning photovoltaic conical section structures. This aspect reduces overall manufacturing cost and systemic complexity. In this step of the design specification, the surface of the outer optical lens concentrator is coated with an infrared coating that rejects the heat that is propagated from the Sun or any other light source. This feature sustains a beneficial heat dispersion gradient based on the idea that the less heat that bombards each of the cone-rotor photovoltaic sections, and must be then convected to the embodiment's specialized heat sink system, equates to higher electron output from each trigonal PV section. The heat sink structure fully exploits the Peltier effect and the thermo-cooling effect in order to produce more DC electrical power that can be (1) added to the aggregate output of AC power level and or (2) directly routed to appliances and other off-grid apparatuses that require DC power such as light emitting diode (LED) lighting, building security backup systems, and the like, according to one embodiment of the invention.

There are many possible iterations of using Fresnel optical ribbing in sections that comprise the fused border of each trigonal photovoltaic cell. These Fresnel ribbing structures are simply used to allow amplified light energy to pass from one cone-rotor photovoltaic section to another that is offset in a smaller scale.

Today, transparent photovoltaic cells can turn windows into solar panels. The current efficiency of the prototype cells is low. However by utilizing transparent cells that are shaped in cones and essentially stacked on top of each other, electrical voltage efficiency is dramatically increased when coupled with the embodiment's magnetic coupling transform effect, used in many forms since the $19^{th}$ Century. This transform is fundamental to all electrical generators and motors. Embodiments of the invention utilize this transform method in a unique and novel way. These transparent PV materials can be coated onto the embodiment's smooth and transparent conical surfaces. These cone-rotor surfaces will spin freely at very close spatial distances from each other. This feature enables multiple cone-rotor surfaces to produce more electrical voltage power for a given physical footprint. Following this section will be the full description of the photo-electrical protocol, process, and procedure of the embodiments of the invention.

Referring to FIG. 1, according to one embodiment of the invention, a multi-layered 3D geometrical surface-shaped photovoltaic cell array is disclosed and depicted 50. A 3D conical shaped geometric topology is rendered for the purpose of descriptive simplicity. Each cone is comprised of fused photovoltaic (PV) layers 51 that are defined by three or more distinctive cone-rotor layers that are placed and rotate on top of each other. Each cone-rotor is comprised of a plurality of PV sections 216. In this case, each section is a triangular-trigonal shape as shown. In some cases each cone-rotor is populated with transparent photovoltaic material 84. The embodiment's Spin 3D solar power generation surface area is in no way restricted to a geometrical cone shape. There exists a plurality of geometric shapes such a mushroom geometric, a Bucky ball-geodesic, a radian constellation geodesic, and the like, and the definition of cone provided above and the use of the term cone or conical shape in the claims below is meant to encompass such geometric shapes. The embodiment is comprised of a plurality of cone shaped photovoltaic structures that act as spinning cone-rotors.

The cone shaped photovoltaic structures are designed and manufactured as cone-rotors. There is provided a center stabilizing axle 60 that carries the three spin cones. The axle 60 is mounted to the concave stator structure 66 that houses a uniquely designed concentric tri-coil. Each stator tri-coil is embedded and wired in three concave concentric sections 138, 139 and 140 respectively. The concave stator structure houses three concentric toroidal coil(s) 135. Depicted here are three cone-rotors, which all spin and ride on circular maglev tracks 62. At the top of each cone-rotor is a circular magnetic lift (maglev) guideway(s) 59. Embodiments of the invention utilize a novel form of maglev transport. Maglev transport is a means of flying an object along a guideway by using magnets to create both lift and thrust. This method is used to provide transport means of propelling fast moving passenger trains such as the Japanese Bullet trains. This method eliminates any potential friction or drag. The maglev guideway 59 at the top of the cone-rotor is populated with evenly spaced rare-earth magnets that are arranged in a North polarity. Below, each circular track 62 is also populated with evenly spaced magnets that are arranged in a North polarity.

The circular guideway magnets and the track magnets can alternatively be charged in a South polarity. Both the guideway and the track must be charged in the same polarity in order to create lift and thrust for each cone-rotor. Rare-earth magnets are strong permanent magnets that are made from alloys of rare-earth elements. Each magnet is oriented to make use of its North or South polarity. The choice of polarities is arbitrary when the embodiment is manufactured and deployed in an electrical power generating environment. The embodiment's maglev feature also provides additional thrust or torque at the top of each cone-rotor as it spins on the maglev circular track. Each triangular or trigonal PV section 216 produces DC voltage that flows 82 to the bottom of each skirt bottom 192 and to the array of skirt magnets 117 that are evenly spaced in order to maintain equilibrium during a cone-rotor's 360° degree spin cycle that occurs from Earth horizon to horizon.

Cone-rotor one 53 spins 56 in a clockwise pattern, cone-rotor two 54 counter-spins 57 in a counter clockwise pattern, and cone-rotor three 55 counter spins 58 in the same clockwise pattern as cone-rotor one. However, all three cone-rotors spin at different rotational rates because each cone-rotor has a scale factor that is different from adjacent cone-rotors. Each cone-rotor spins at different rates in order to generate electrical energy more efficiently and expose each trigonal photovoltaic section to Sunlight that passes through the outer optical lens concentrator 61.

The Spin 3D electrical power generation system is constantly exposed to Sunlight in an omni directional pattern 63. Because each cone-rotor spins, the Sun 52 is always shining light and propagating heat onto the embodiment's trigonal PV cell surfaces. Each trigonal shaped photovoltaic cell is interconnected to two magnets for each mounted trigonal PV cell. The constantly charged and dynamically switched magnets 94 and 94a are located at the bottom of the skirt of each cone-rotor as shown in the cone-rotor skirt cross section 207 in in FIG. 9. Note that the stator magnets are shown here by a X-210, Y-211, and Z-212 designation as defined in the illustrated terminology legend 215.

Figure 3:
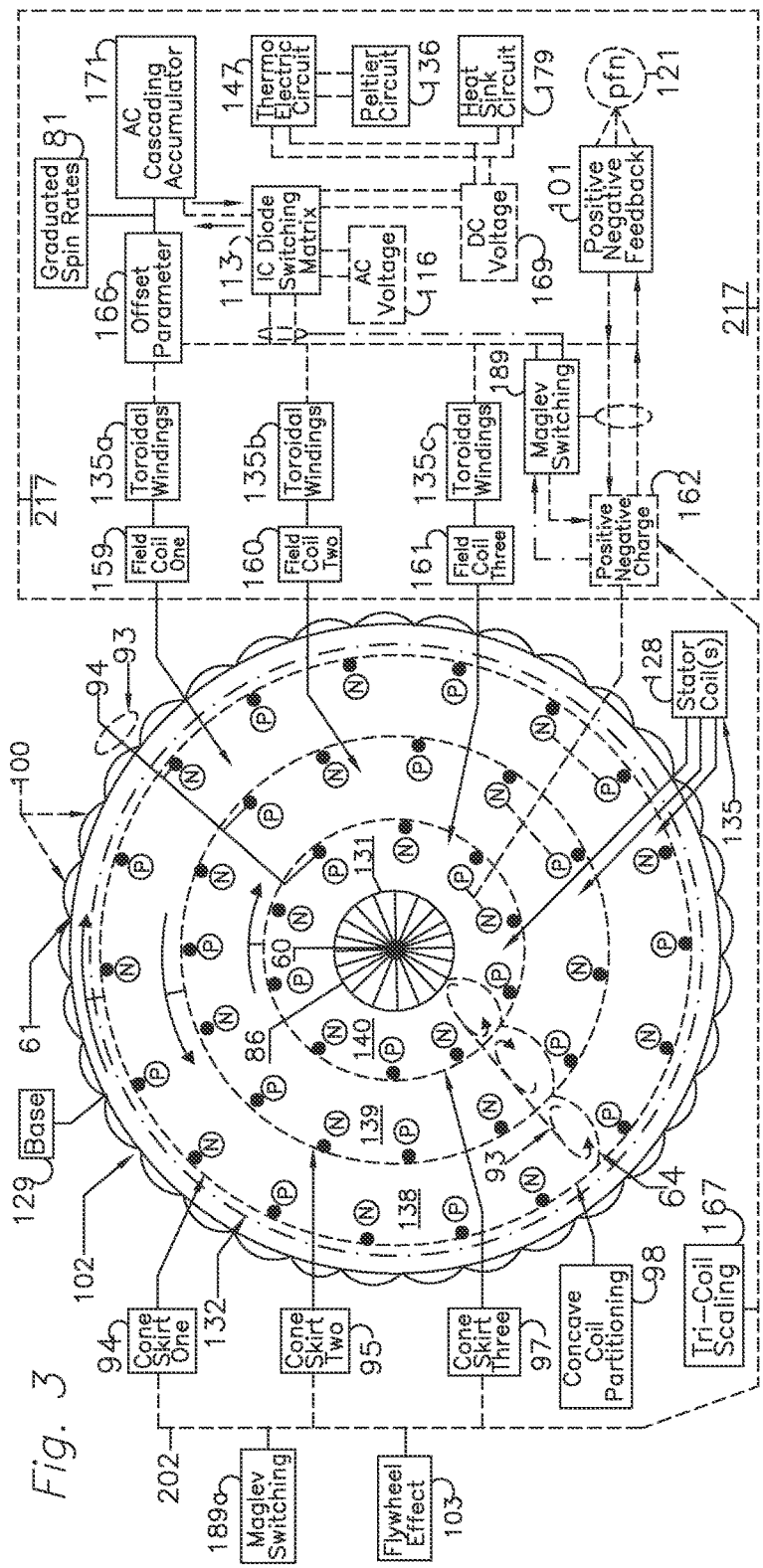
FIG. 3 depicts a Spin 3D multi-cone-rotor and associated stator-coil array with logical protocol flow circuits, according to an embodiment of the invention.
Figure 9:
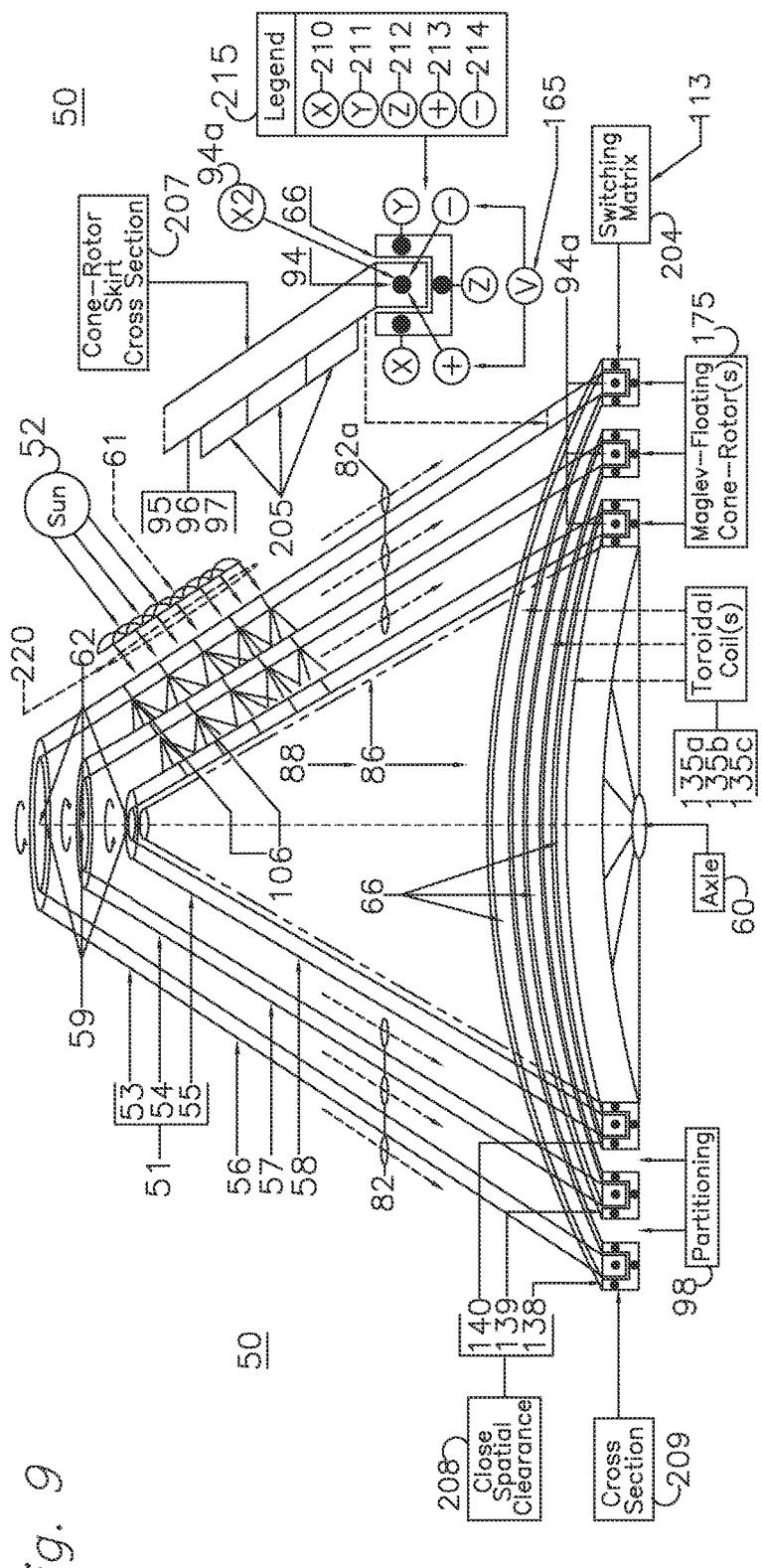
FIG. 9 depicts and Spin 3D stator array with an extruded view of the cone-rotor skirt with magnets, according to an embodiment of the invention.

Referring to FIG. 1, the DC power flows 82 down to each charged magnet. Once the DC voltage reaches each magnet, positive(p)-negative(n)-positive(p) 90 and/or negative(n)-positive(p)-negative 91 interpolating directly produces alternating current (AC) 92 without the need for inefficient conventional DC to AC voltage inversion processes and procedures. The invention provides AC current from the simple electro-mechanical interaction of the spinning cone-rotor(s) with each toroidal coil(s) 135, controlled and regulated by switchable circuitry means as shown in FIG. 3. Depicted here are selected circuitry components such as an integrated circuit(s) (IC), diode, transistor, capacitor, and resistor switching matrix 113. In FIG. 9, a plurality of integrated circuits (IC) diodes, capacitors, transistors, and resistors are mounted 205 on the cone-rotor skirt one 95, cone-rotor skirt two 96 and cone-rotor skirt three 97 respectively. Each concave coil 138, 139 and 140 resides in a dedicated portion of the concentric stator structure 66.

Figure 7:
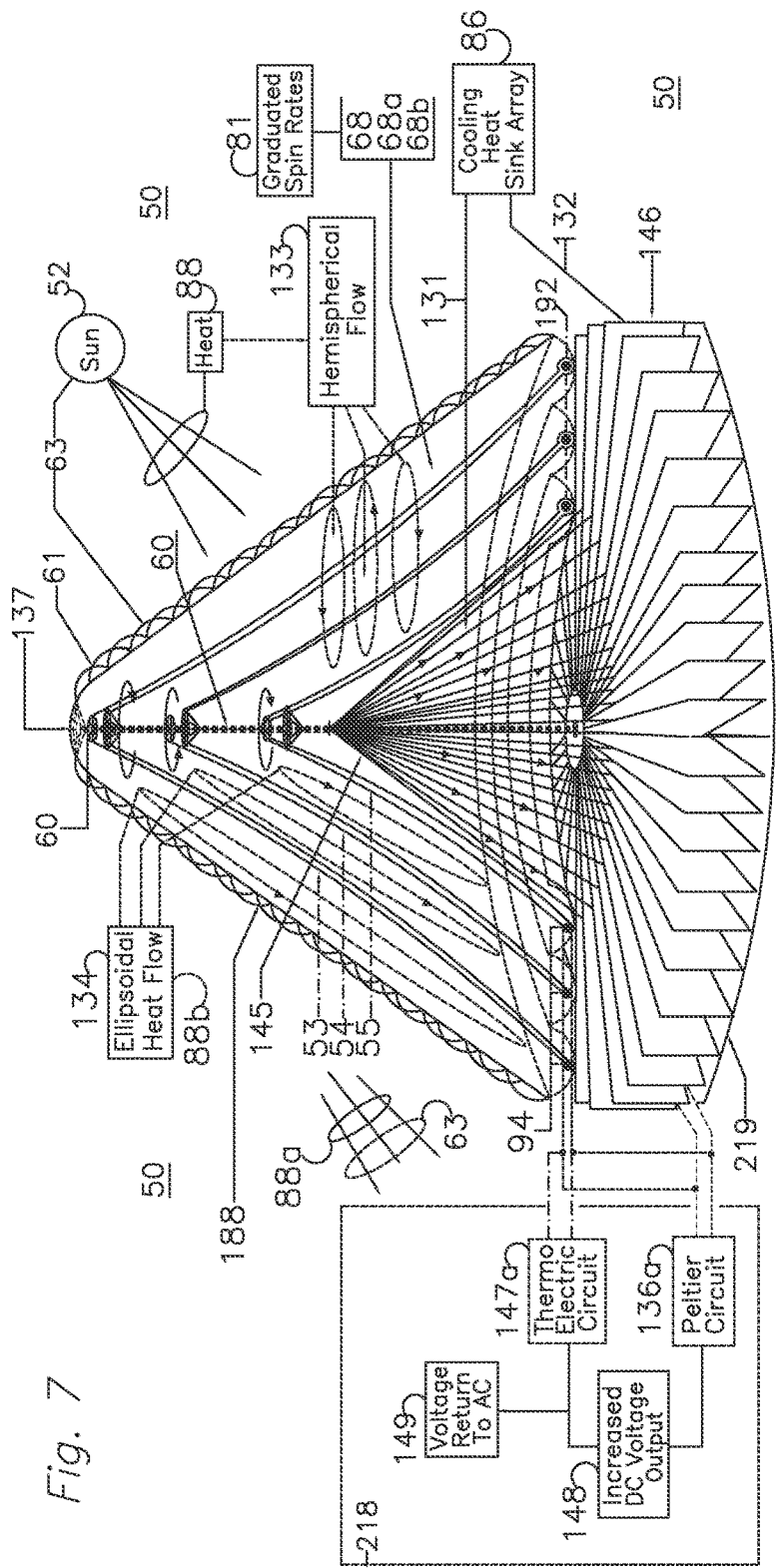
FIG. 7 depicts the Spin 3D power generation with cooling heat sink, according to an embodiment of the invention.

Electro-magnetic levitation induces each cone-rotor to float 175 and is enabled from the simple interaction of the DC powered cone-rotors as DC voltage 82 flows from each trigonal PV cell 216 as shown in FIG. 1, with the bottom toroidal coils 135 that reside in the concave stator structure 66. The counter rotating interaction between cone-rotors produces a novel electron positive-negative electron flipping effect 64 that enables the production of increased AC voltage flow 116. In FIG. 3 and FIG. 7, a plurality of integrated circuit (IC) matrixes 113 and selected logical circuits are shown that perform logical instruction sets within an electronic topology 217. The electronic circuits reside on cone-rotor skirts and an integrated IC board 218 that is fitted at the bottom of the spin cell base 219 below the heat sink 146, according to one embodiment of the invention.

Figure 2:
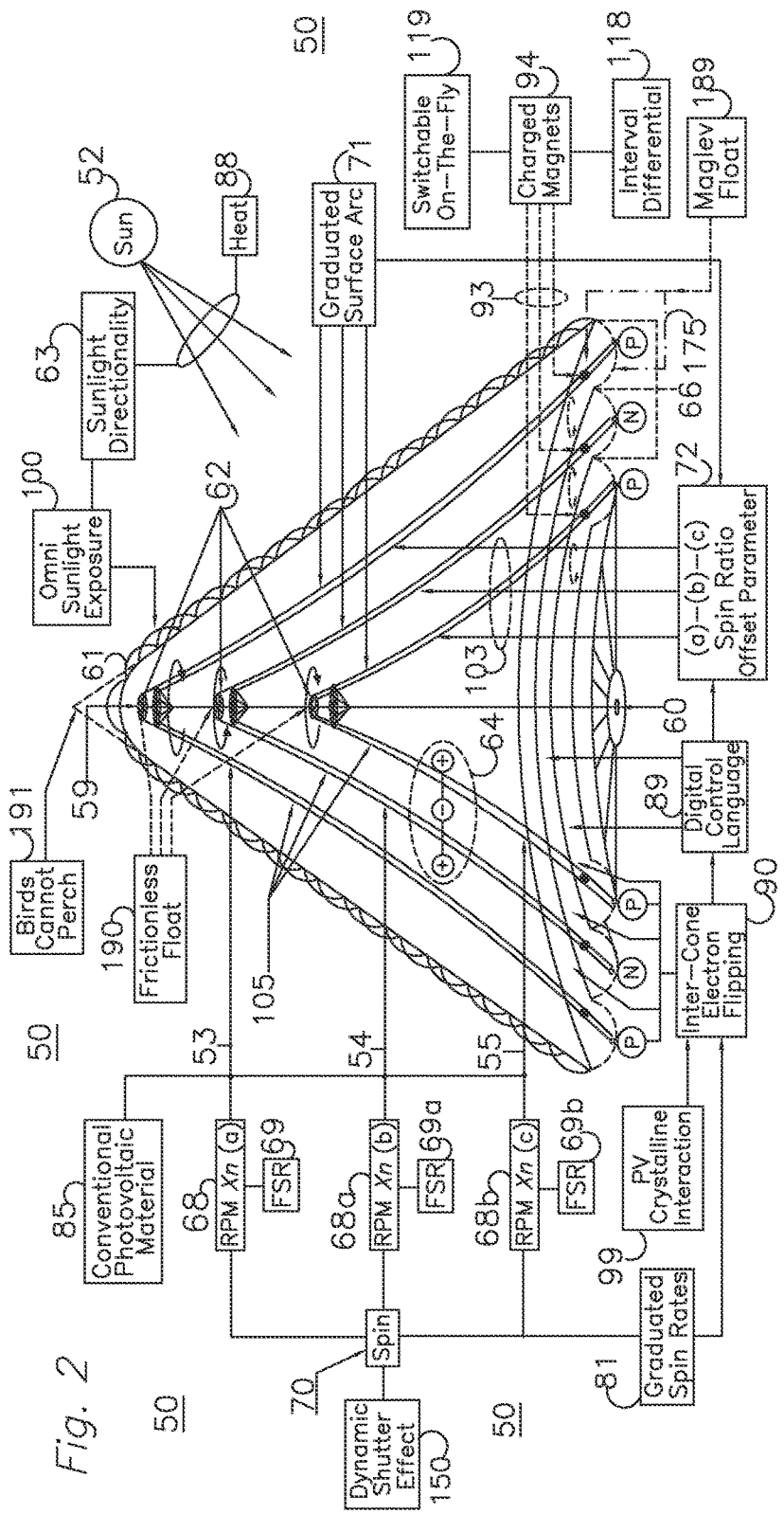
FIG. 2 depicts the cone-rotor(s) stator array and flash spin rate (FSR) and its component parts, according to an embodiment of the invention.

Referring to FIG. 2, the Spin 3D power generation system 50 and its cone-rotor surfaces can be comprised of conventional photovoltaic material 85. One embodiment of the invention is the method whereby the spin rate of cone-rotor one 53, cone-rotor two 54, and cone-rotor three 55 are controlled, managed, and fully exploited. Each cone-rotor spins at a predetermined revolutions per minute (RPM) rate, 68, 68a, and 68b respectively. The spin rate determines how much electrical wattage is produced, due to a function of the entire Spin 3D power generation system, disclosed here as flash-spin-rate (FSR). The flash spin rate is a controlled phenomenon of the embodiment's unique approach to the photoelectric effect. Due to RPM 68, 68a, and 68b, each cone-rotor 53, 54, 55 produces its own flash rate which is based upon an aggregate optical effect derived from the cumulative action of (1) the outer optical lens cover that is populated with Fresnel lenses and other optical enhancement elements and (2) the spin effect of the embodiment's trigonal PV shapes, also adding significantly to flash spin rate (FSR) electrical voltage-wattage power yield. Coupled with the Fresnel and other optical ribbing that borders and fuses each trigonal PV section, a massive increase of PV power output is gleaned.

The FSR rate is also coupled with the dynamic optical and electrical shutter effect (DSE) 150. As light is passed from the outer optical lens cover to the trigonal PV cells that are located on each cone-rotor i.e., cone-rotor one 53, cone-rotor two 54, and cone-rotor three 55, an increase in electrical-voltage energy is made evident. In FIG. 2, the spin rates for each other are determined by a number of key factors. All cone-rotors, 53, 54 and 55 spin at a rate that determines a proper periodic pulse rate. However, the spin rate for each cone varies based upon (1) the angle of the Sun at a particular time of year, and (2) the level of heat that is received, detected, and measured by the tracking program means and methods, according to one embodiment of the invention. Each cone-rotor spins, and the slanted Fresnel ribbing also acts as an impellor that directs the received heat towards the lower part of the spin cell. The cooling heat sink array 86 also draws the heat to its surfaces, convects the heat to the external environment and converts the heat to electrical voltage for use for additional direct current (DC) output, according to one embodiment of the invention.

The heat to voltage conversion is performed by an efficient utilization of the Peltier effect that is enabled by an integrated Peltier circuit 136, and thermo electric circuit 147 as shown in FIG. 3, according to one embodiment of the invention. The logical circuit topology 217 embodies a broad scope of electrical, analogue and digital wave form processing components that populate an electrical-electronic processing board. Also included here are components such as integrated circuits, diodes, and capacitor switching matrices. 113. In this topology 217, bi-directional propagation of cone-rotor synchronization through voltage input taps and output taps of toroidal windings 135a, 135b, 135c maintains systemic communication and efficiency. Toroidal metallic windings are wound around a circular magnetic form, and comprise field coil one 159, field coil two 160, and field coil three 161.

Referring to FIG. 9, each field coil 135a, 135b and 135c is wound in a toroidal coil pattern. Each toroidal field coil has multiple voltage input taps and output taps. Stator electromagnets 210-X, 211-Y, and 212-Z, act as voltage input taps and output taps. Stator electromagnets are interconnected via metallic conductors that are wound around a magnetic core. A magnetic core is a piece of magnetic material with a high permeability used to confine and guide magnetic fields in electrical, electromechanical, and magnetic devices such as electro magnets, transformers, electric motors, inductors, and other magnetic assemblies.

A magnetic core is typically made of ferromagnetic metal such as iron, or ferromagnetic compounds such as ferrites. The use of a magnetic core can substantially concentrate the strength and increase the effect of magnetic fields produced by the direct current (DC) voltage that is produced by the trigonal-triangular photovoltaic (PV) sections and associated skirt magnets 94, 94a and electromagnetically transferred to each of the tri-toroidal-coils 135a, 135b, and 135c that comprise the concave stator structure 66. Each trigonal-triangular PV section is interconnected to one positively charged electromagnet and one negatively charged electromagnet which adds up to two cone-rotor skirt magnets 94, 94a per trigonal-triangular PV cell section. When a cone-rotor electromagnet passes a tri-coil magnet X-210, Y-211 and Z-212 the magnets 94, 94a that are charged as positive 213 and negative 214 polarities transfer electrical voltage to the tri-coil magnet(s) that are evenly spaced around each toroidal coil 135a, 135b, and 135c. During this rotational transfer each toroidal coil is electro-magnetically energized and simultaneously propels each cone-rotor in a circular pattern or torque.

This electro-magnetic propulsion simultaneously produces alternating current as voltage is passed from the skirt electromagnets to stator toroidal coils 135a, 135b and 135c. This is the direct result of the seminal Hippolyte Pixii effect. This effect is also known as the magnetic coupling transform. As each cone-rotor rotates, these components comprise toroidal coils 135a, 135b, and 135c that comprise the complete tri-coil stator array. Three toroidal coils are connectively integrated as one tri-coil shown here in FIG. 10. Referring to FIG. 9, and FIG. 3, flywheel and gyroscopic effects occur when a cone-rotor is in a state of spin. Once in a state of spin, the motive force, also known as torque, is sustained. The flywheel effect and the gyroscopic effect combine with the simple magnetic advance propulsion provided by the direct current (DC) to alternating current (AC) transform. In this way a minimum of electrical energy is lost.

Figure 5:
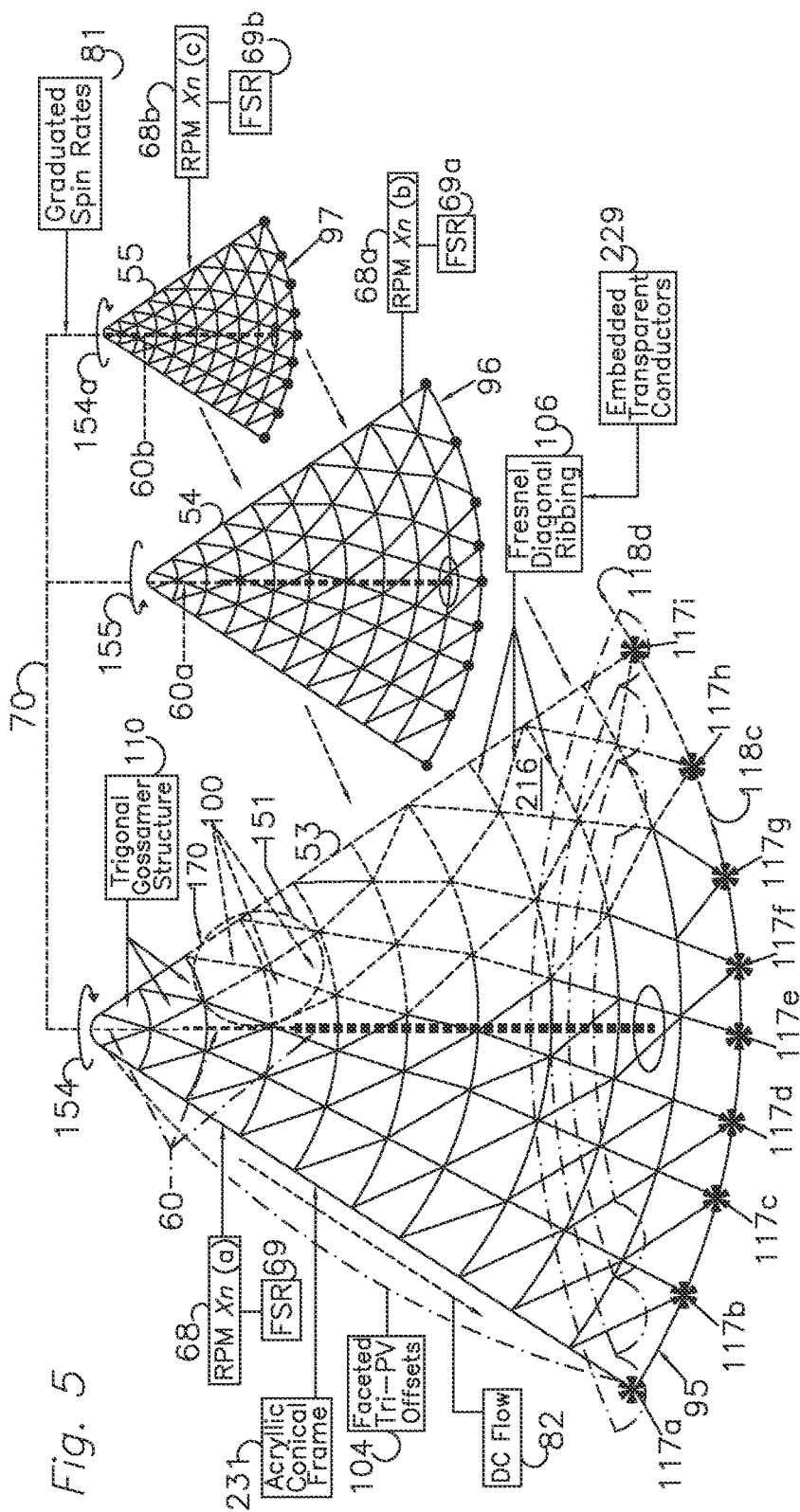
FIG. 5 depicts the Spin 3D power generation system with three cone-rotors illustrated with trigonal photovoltaic segments, according to an embodiment of the invention.

Referring to FIG. 5, each cone-rotor is comprised of light weight photovoltaic material. Each trigonal-triangular shaped PV cell section is mounted on the conically shaped frame 231 which is comprised of transparent acrylic material polymer. This material is preferred, for it can be molded into the desired Fresnel lens ribbing shape 106. In FIG. 3 and FIG. 9, the top brackets that hold the maglev circular guide(s) 62, and the maglev circular track(s) 59 are integral to the acrylic conical frame and do not add significantly to the overall weight characteristics of each cone-rotor. Attached to the cone-rotor skirt 207 are IC diode(s), switching matrix 205 capacitors, and other components which are quite small in overall size and extremely light in weight. All physical structures that comprise each cone-rotor, 53, 54, and 55 along with the attached electronic components are distributed evenly and manufactured in a gyroscopically balanced fashion.

Referring to FIG. 2 for example, when connected to an electrical grid, the frequency rate must be maintained at 60 Hz or 50 Hz. The spin rate 68, 68a, and 68b determine the flash spin rate (FSR) 69, 69a, and 69b of each cone-rotor. The flash spin rate is based on the amount of sunlight that can be fully received as it passes through the outer optical lens housing 61 and reaches the spinning surface of cone-rotor one 53, cone-rotor two 54 and cone-rotor three 55. The flash spin rate is directly associated with the dynamic shutter effect 150. In this case, received light as it passes through Fresnel lenses is intensified, in some cases 500:1. However the negative aspect of this effect is that it also increases heat. Increased heat causes PV sections to generate much less energy and in some cases to stop functioning altogether. The embodiment's (a) Fresnel lens focal plane horizon-to-horizon effect encompasses the (b) flash spin rate (FSR) effect, (c) and the dynamic shutter effect 150. These optical-electromagnetic effects are orchestrated together in a construct that provides optimum power generation output.

Figure 11:
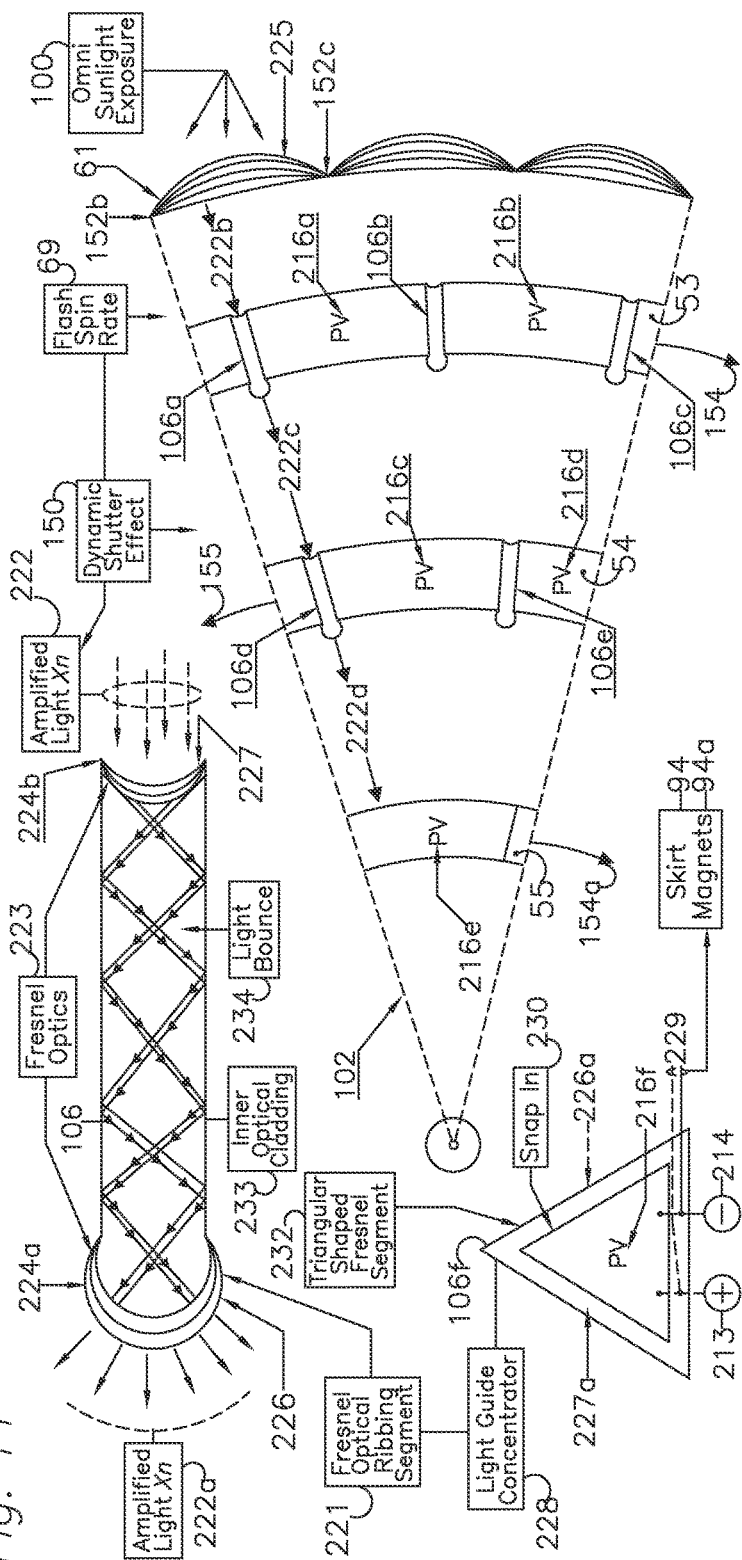
FIG. 11 depicts Fresnel optical ribbing segments and light intensifying effects, according to an embodiment of the invention.

Referring to FIG. 11, the Fresnel lens flash spin rate (FSR) is an optical-electrical effect, which functions in tandem with the dynamic shutter effect (DSE) 150. Illustrated in FIG. 11, is a section or geometric sector of a circular top down view of cone-rotor one 53, cone-rotor two 54, and cone-rotor three 55, according to one embodiment of the invention. These three cone-rotor sectors are comprised of trigonal-triangular photovoltaic sectors 216a, 216b, 216c, 216d and 216e. Each trigonal-triangular PV sector is physically joined together with transparent Fresnel optical ribbing 106a, 106b 106c, 106d, and 106e. Referring to FIG. 5, depicted here is an example of how Fresnel optical ribbing 106 physically borders and joins each PV section 216. In FIG. 1, a PV section 216 is extruded to show its trigonal-triangular shape. In FIG. 9, a cross section of cone-rotor one 53, cone-rotor two 54, and cone-rotor three 55 depict a simple example of the side view of Fresnel optical ribbing 106. Here is also shown a section of the outer optical Fresnel lens concentrator 61. The Fresnel effect substantially magnifies light from any light source. In this case the Sun 52 provides light and heat 220. Referring to FIG. 11, here is depicted a Fresnel optical ribbing segment 221. The segment example is shown here as being set between each PV section, 106a, 106b, 106c, 106d and 106e. The Fresnel optical ribbing segment 221 depicted here is a visually expanded example which shows how Fresnel optical ribbing functions in this case, and why it is important as part of the specification of the means and methods of the embodiment.

In optics and video camera image gathering there is an effect called a global shutter effect. Embodiments of the invention use this effect dynamically. This effect was first discovered in the early days of cinematic film camera and film stock development and usage, and is seen to cause drawbacks in terms of detecting and recording sharp images during capture.

In cinematic applications, the effect produces image blur because of double sampling, injection of parasitic light, and larger pixelization in terms of light spread over a video camera pick up target array. A pick up target area is centered on the image capture surface of devices such as charge coupled devices (CCD), vidicon tubes, or other such video image detection systems used by modern video cameras, and is compromised in image quality due to the effects of global shutter effect. However, the embodiment utilizes these effects in an advantageous and beneficial means and method. This dynamic shutter effect is utilized in order to excite all crystalline substrate particles from all possible angles as each cone-rotor rotates under each Fresnel optical lens element 225. These crystalline particles reside within the substrate layers of each photovoltaic section and are excited as they pass under each Fresnel optical lens element that amplifies light into the multiple layers.

As each cone-rotor spins there it is an interrelationship of the Fresnel optical ribbing segment 221. This section or segment is simply a means of showing a top down view with respect to the interrelationship with the three cone-rotors. However, the complete Fresnel ribbing segment is shaped as a triangular Fresnel light guide that functions as a triangular shaped light concentrator 228. Referring to FIG. 5 and FIG. 11, the single photovoltaic section 216 as shown in FIG. 5, is clearly set inside a triangular shaped Fresnel diagonal ribbing 106 light guide concentrator 228 as shown in FIG. 11. Each triangular shaped Fresnel ribbing segment 106f is actually a component of the complete trigonal gossamer structure 110 as shown in FIG. 5 that comprises each cone-rotor 53, 54, and 55. This entire transparent gossamer-conical structure is comprised of acrylic compounds which are manufactured in an injection molding process as one integral form factor. In some cases transparent electrical conductors are imprinted on the inner surface of the embodiment's Fresnel ribbing.

As each trigonal PV element passes each other element on an adjacent cone-rotor, interacting with the Fresnel ribbing, an optical-electrical aperture is created, not unlike how a camera obscura functions. In this way, the captured light spreads out as the light strikes each Fresnel lens on the outer optical lens concentrator, passes to the Fresnel ribbing and onto each trigonal PV cell surface(s) as each cell spins in a counter rotational progressive vector path. Each cone-rotor 53, 54, and 55 rotates in a different spin ratio offset parameter 72. This phenomenon is due to a number of features. (1) Each cone is designed and fabricated with a different height and width. (2) Each cone is also designed and manufactured with a graduated optical surface arc 71, enabling and enhancing Sunlight and heat concentration. (3) Each cone has a different physical footprint, and each element of the Spin 3D power generation system may run at different graduated spin rates 81 in order to produce the highest electrical power output product per frequency cycle. (4) The embodiment's circuitry and IC control means enable switchable-on-the-fly 119 synchronization rates that give optimum AC and DC electrical voltage power output when different power demand loads are present.

Each cone-rotor's spin rate can be varied in order to glean as much electrical voltage as possible, regardless of the current position of the Sun 52, or its directionality 63 as it arcs across from horizon-to-horizon and the like. This feature also enhances light detection and voltage production on a cloudy day. The FSR, 69, 69a, 69b and the dynamic shutter effect 150 make use of all available ambient light, according to one embodiment of the invention. The Spin 3D electrical power generating system is exposed to Sunlight omni-directionally 100, according to one embodiment of the invention. Different cone-rotor spin rates are easily achieved without undue power consumption through the Tesla effect magnetic couple transform and the embodiment's use of the maglev effect 175.

Figure 6:
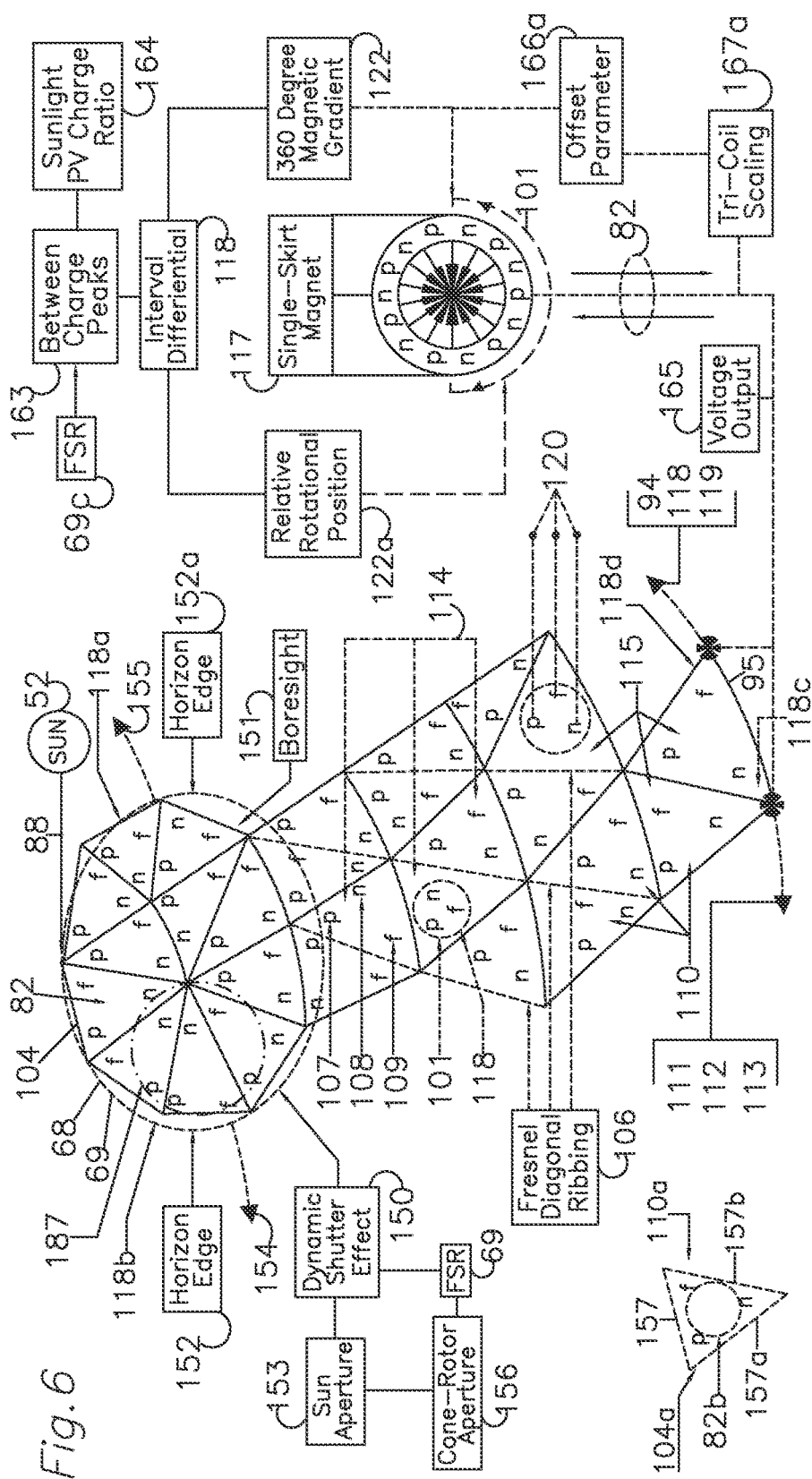
FIG. 6 depicts trigonal photovoltaic segments of Spin 3D power generation cone-rotor(s) in an offset illustration, according to an embodiment of the invention.

Referring to FIG. 5 and FIG. 6, depicted in these two closely linked drawings are the architectural structures, protocols, processes, and procedures of an embodiment of the invention. In FIG. 5, cone-rotor one 53, cone-rotor two 54, and cone-rotor three 55 are depicted. Each cone-rotor is clearly arrayed with a plurality of faceted trigonal PV offsets 104 and set in a trigonal gossamer structure 110 which is constructed of clear composite material such as acrylic, and molded with integral sunlight-amplifying Fresnel ribbing as shown in both FIG. 5 and FIG. 6. In FIG. 5, each cone-rotor 53, 54 and 55 spins at different RPM 68, 68a and 68b rates due to the fact that each cone-rotor is built to a different scale factor. The outer cone-rotor one 53, is of a larger scale than inner cone-rotor two 54 and inner cone-rotor three 55 respectively. Each cone-rotor is comprised of trigonal shaped photovoltaic cells that produce direct current (DC) 82 which flows from its mounted position on the cone-rotor skirt 95 providing energy to two magnets 117h and 117i, for example.

Figure 8:
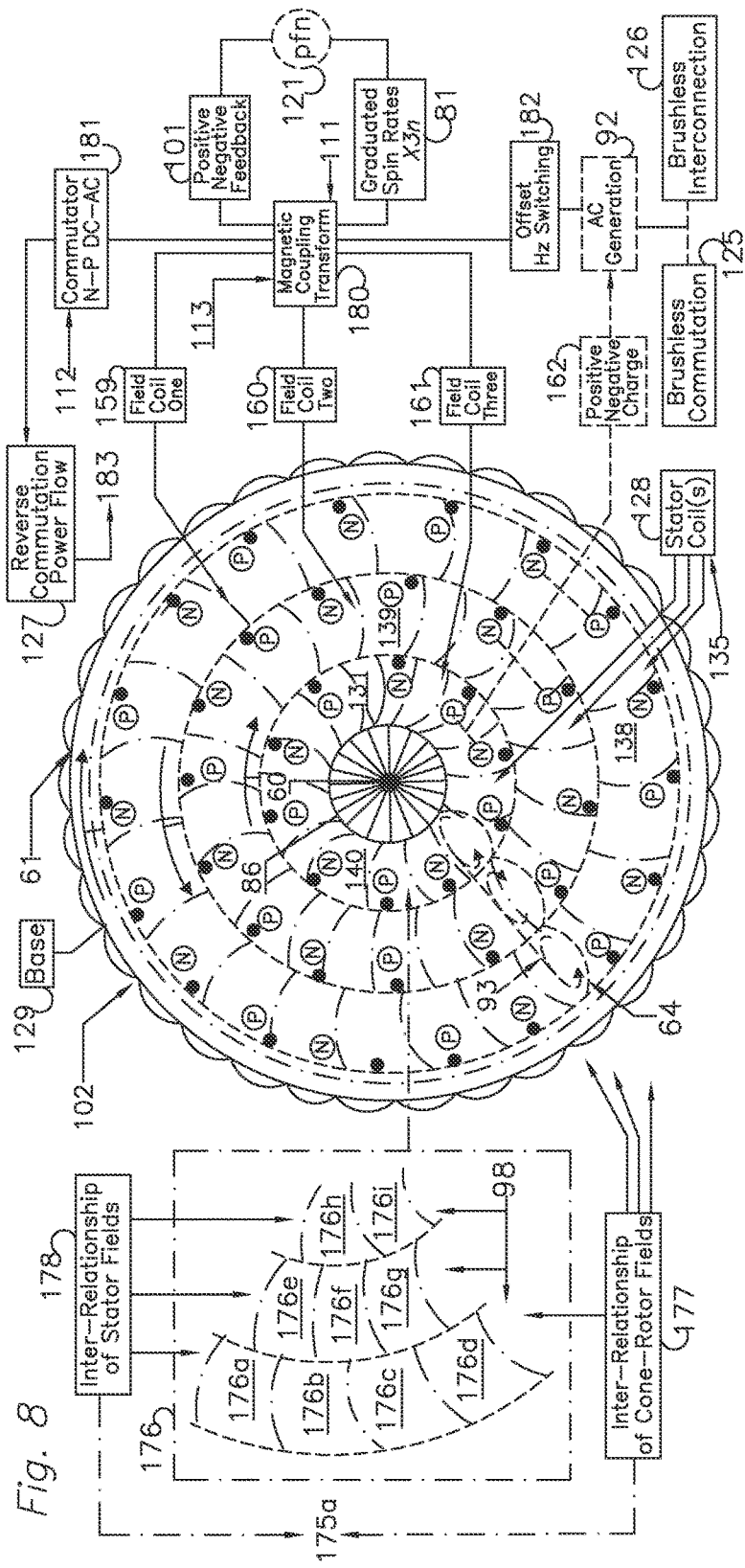
FIG. 8 depicts the Spin 3D power generation stator tri-coil with additional logical circuits, according to an embodiment of the invention.

Referring to FIG. 6, a single skirt electromagnet arrangement 117 is incrementally charged as DC voltage flows 82, 82b from a selected trigonal shaped photovoltaic cell 104 and 104a for example. Each trigonal PV cell has a positive circuit 107, a negative circuit 108, and a feedback circuit 109. The feedback circuit 109 interrelates as a relative rotational position 122a with respect to the 360° degree magnetic flux gradient 122 that any electrically charged magnet possesses, such as the embodiment's cone-rotor skirt electromagnet 117. The embodiment utilizes a magnetic coupling transform integrated circuit (IC) switching matrix 113 as shown in FIG. 3. This IC diode matrix also includes low cost digital signal processors (DSP) and the like. This specialized matrix is used to govern accurate magnetic polarity control between magnetic charge peaks 163 gleaned from PV charge ratio 164 predictions. The feedback circuit constantly measures the electromagnetic phase variable interval-differential 118 that exists between each p-n-p-n-p-n offset parameter 116a, interrelating each concentric field tri-coil 159, 160, and 161 in a dynamic tri-coil scaling 167a feedback relationship. Each concentric field tri-coil is wired in graduated offset partitions 176, as shown in FIG. 8. Each partition 176a, 176b, 176c, 176d, 176e, 176f, 176g, 176h, and 176i, as shown in this tri-coil partition segment 176, is inter-switched on-the-fly between skirt electromagnets 117a, 117b, 117c, 117d, 117e, 117f, 117g, 117h, and 117i as shown in FIG. 5.

The skirt electromagnets on a particular one of the three cone-rotors electromagnetically interrelate to each other, as does every skirt electromagnet on every other cone-rotor within a single Spin 3D power generation device and every cone-rotor electromagnet on every other Spin 3D power generation apparatus in a selected Spin 3D power generation network. In FIG. 8, each tri-coil partition 176a, 176b, 176c, 176d, 176e, 176f, 176g, 176h, and 176i, relates to a charged skirt electromagnet, as each cone-rotor spins within the environment of a single Spin 3D power generation apparatus. The same principle holds true for a large multiple array of Spin 3D power generation systems that comprise a complete solar power generation network.

Referring to FIG. 6, unique intersystem and intrasystem switching and control is made possible because of the unique means and method of the embodiment with respect to its essential electromechanical spin. Cone-rotor one 95 spins clockwise 154 in this case, and as it spins each trigonal faceted PV cell 104 and 104a passes under a selected Fresnel lens 187. In FIG. 5 and FIG. 6, as the top cone-rotor 53 spins, each trigonal PV cell passes one or a plurality of Fresnel and or other optical lenses. This action induces a dynamic shutter effect 150. This occurs in accord with full exposure of Sunlight at a constant peak angle because of essential spin effects. When the trigonal PV cell moves into position to receive a quantum of Sunlight, the trigonal PV cell electrical voltage slope is measured to reveal full voltage output during an arbitrary sampled moment in time. Each trigonal is wired independently to a pair of skirt magnets, which rotate past a selected stator tri-coil segment partition as shown in FIG. 8, 176a, 176b, 176c, 176d, 176e, 176f, 176g, 176h, and 176i. In FIG. 6, a Sun aperture 153 is established on the surface of the photovoltaic trigonal element with Fresnel lens segment 187. The illuminated PV area fully and independently passes voltage to one or a plurality of tri-coil segments of a given toroidal coil. As one or a plurality of trigonal PV cells 104, as depicted in FIG. 6, passes under one or a plurality of Fresnel or optical lenses, an increase in light and heat is generated. In FIG. 6 the Sun 52 propagates sunlight in a horizon-to-horizon boresight 151. As a plurality of trigonal PV cells pass under a plurality of Fresnel lenses or other optical elements, each generates DC voltage independently of each other. As the DC voltage flows from each trigonal PV cell to each interconnected skirt magnet pair, each charged magnet passes over the tri-coil segment partition(s) as shown in FIG. 8, 176a, 176b, 176c, 176d, 176e, 176f, 176g, 176h, and 176i.

In FIG. 6, cone-rotor one's skirt 95 passes over the tri-coil segment. A simple magnetic coupling transform occurs, which directly produces alternating current (AC). The AC is switched and cascaded to the accumulator 171 by electrical circuitry and switching means as shown in FIG. 3, and forwarded to an electrical voltage load destination that is any electrical off-grid or on-grid load demand. The embodiment can supply AC and DC voltage to any electrical load demand source from the each trigonal-triangular photovoltaic segment.

Referring to FIG. 5, depicted are cone-rotor one 53, cone-rotor two 54, and cone-rotor three 55. Note that cone-rotor three 55, fits under cone-rotor two 54, and cone-rotor two 54 fits under cone-rotor one 53. Also note that the trigonal PV cells 104 are mounted in faceted offsets. As disclosed, each trigonal PV cell is joined together by optical Fresnel or other optical ribbing 106 that is also shown in FIG. 6. In FIG. 11, which is a top-down point of view, Fresnel ribbing segment 106, 106a, 106b, 106c, and 106d are shown. A front view of the triangular shaped segment 106e is a light guide concentrator 228. This light guide is surrounded by a transparent cladding material 233 with a lower index of refraction. Light is kept in the core by total internal reflection. Because of the Fresnel input 227 and output 226, light bounce 234 becomes a beneficial effect.

This key effect enables optimum amplified light spread so that all input and output light angles and surfaces are bathed in light.

This feature ensures that the total energy received from sunlight is sustained while it propagates from one end of the Fresnel segment to the other. This causes the light guide to act as a low loss waveguide. In FIG. 11, the Fresnel segment example 106 illustrates how received sunlight is amplified 222 at the input side which is a concave shape 227 and propagates inside the light guide it bounces off the reflective optical cladding 233 until it arrives at the concave 226 end which is Fresnel shaped in order to amplify light 222a where it is passed onto the surface the next inner cone-rotor. In FIG. 5 and FIG. 11, as cone-rotor one 53 spins, each faceted optical rib intensifies and focuses Sunlight or other incident light and heat onto cone-rotor two 54. As cone-rotor two 54 spins, its fused and faceted Fresnel ribbing also passes Sunlight or other incident light onto cone-rotor three 55. Note that all cone-rotors are spinning and counter spinning relative to each other. During this multi-surfaced spin, multiple dynamic shutter effects are occurring.

In FIG. 11, each trigonal-triangular shaped PV 216a, 216b, 216c, 216d, 216e, and 216f is encased in a triangular shaped Fresnel optical 223 light guide concentrator 228. Depicted is a triangular shaped 232 Fresnel segment 106f which is molded in the form of a convex Fresnel surface 227, 227a and a convex Fresnel surface 226, 226a. Light passes from the Fresnel lens 225 that resides on the outer optical lens concentrator 61 which amplifies light from cone-rotor one 53, to cone-rotor two 54 and cone-rotor three 55 in a series 222b, 222c, and 222 respectively. Each segment amplifies light to each inner cone. This means and method insures that there is minimal light loss between each cone-rotor as they spin clockwise 154, counter-clockwise 155 and clockwise 154a at different spin rates. The convex Fresnel lens frontal surface 227 amplifies light 222, and passes it to the other end of side of the segment 226 which is molded in the form of a concave Fresnel lens. Each trigonal-triangular PV section 216f is snapped into 230 a selected triangular shaped Fresnel segment 232. This Fresnel segment is a physical border and a continuous extension of an entire conical frame 231 as shown in FIG. 5, that comprises a triangular web lattice, injection molded of transparent acrylic material.

Referring to FIG. 11, on the inside of each cone-rotor triangular web lattice structure are embedded and/or printed transparent electrical conductors 229 which carry voltage to skirt magnets 94, 94a that are positive +213 and negatively −214 charged from the voltage output of each trigonal-triangular PV cell section 216f. The disclosed means and methods of the dynamic shutter effect (DSE) 150 and flash spin rate 69 are based upon some additional aggregate effects. The operational spin function of each cone-rotor 53, 54 and 55 in relation to each other exploits some interesting optical-electrical effects. The counter rotation or counter clockwise 155 spin trajectory of cone-rotor two 54 enables some key effects.

The outer optical lens concentrator 61 acts as a physical shroud or enclosure. The physical enclosure characteristic of the concentrator-shroud provides protection from the vagaries of weather cycles, the deleterious effects of rain water, and the effect periodic maintenance when cleaning fluids are used. The outer shroud also prevents the ingress of insects, and other potential problems. The outer shroud remains stationary as the cone-rotors spin inside. The outer optical enclosure is designed and manufactured with an injection molding process in acrylic material. The injection mold itself is designed to form Fresnel lens elements 225 that are designed in gradient patterns on both the outer and inner surfaces of the lens elements. The Fresnel lens elements protrude in a convex geometric shape. This convex shape contributes to some advantageous optical and electrical effects.

Embodiments of the invention provide variable optical control over how Sunlight or any other light source is spread and de-spread over the surface of each trigonal-triangular PV section as it spins. As previously disclosed, embodiments of the invention provide the electronic control means to speed up or slow down the revolution rate. By being able to provide accurate spin rate control, the embodiment maintains optimum energy harvesting regardless of the position of the Sun. This feature is designed to optimize the reception of Sunlight angle at any time of day. The stationary outer optical Fresnel lens elements 225 acts equivalent to a stationary cinematic film gate. A film gate is the rectangular opening in the front of a motion picture film camera where the film is framed and exposed to light. The film stock is held on a uniform plane at a calibrated distance in the gate by a pressure plate behind the film. In the same way a film is framed and exposed to light, sunlight is framed by the Fresnel elements on the outer optical lens concentrator. In addition, as light is passed from the Fresnel lens element, each Fresnel triangular border or Fresnel segment catches the light that surrounds each triangular-trigonal PV cell section 216 during rotation and transmits it to the spinning PV material on the adjacent cone.

In FIG. 11, each Fresnel ribbing segment, 106a, 106b, 106c, 106d, and 106e act as periodic shutter(s). In the filmic form, standard film speed is conventionally held at 24 frames per second. Each trigonal-triangular PV section passes a Fresnel element 225, segment 106a to 106f, similar to the manner in which a frame of film in a motion picture camera or projector passes the film gate. However where filmic shutters block out light, the embodiment's Fresnel segment shutters allow amplified light to pass from the outer Fresnel element, to cone-one 53 segment 222, 222b, cone-rotor two 54 segment 222c and 222d to cone-rotor three 55. Certain optical anomalies, such as image keystoning, stretch and distort a projected film image. This effect is seen as a problem in cinematic applications. However, embodiments of the invention use these optical effects to a great advantage. Each Fresnel element 225 and trigonal-triangular segment 106a to 106f, have horizons 224a, 224b.

The convex 226, 226a and concave 227, 227a end of each lens segment have their own horizon edges 224a, 224b. As each cone-rotor rotates, sunlight strikes the edge of a trigonal-triangular Fresnel segment 232, which is shown in cross-section as 221. Light is amplified 222. Sunlight strikes the edge of a selected cone-rotor as it rotates from the back or dark side of spin 3D cell past the horizon 152b to 152c of each Fresnel element 225. A light intensifying flash effect occurs that spreads the light across the surface of the convex 227, 227a edge of the Fresnel segment, and light spreads across the entire convex surface. As sunlight strikes the concave end and the cone-rotor turns, all possible light propagation angles are utilized during the complete horizon 224b, 152b to horizon 224a, 152c angle traverse. The convex end 226, then spreads all angles of light to the next cone-rotor photovoltaic (PV) cell sections 216a, 216b, 216c, 216d and 216e respectively.

Figure 10:
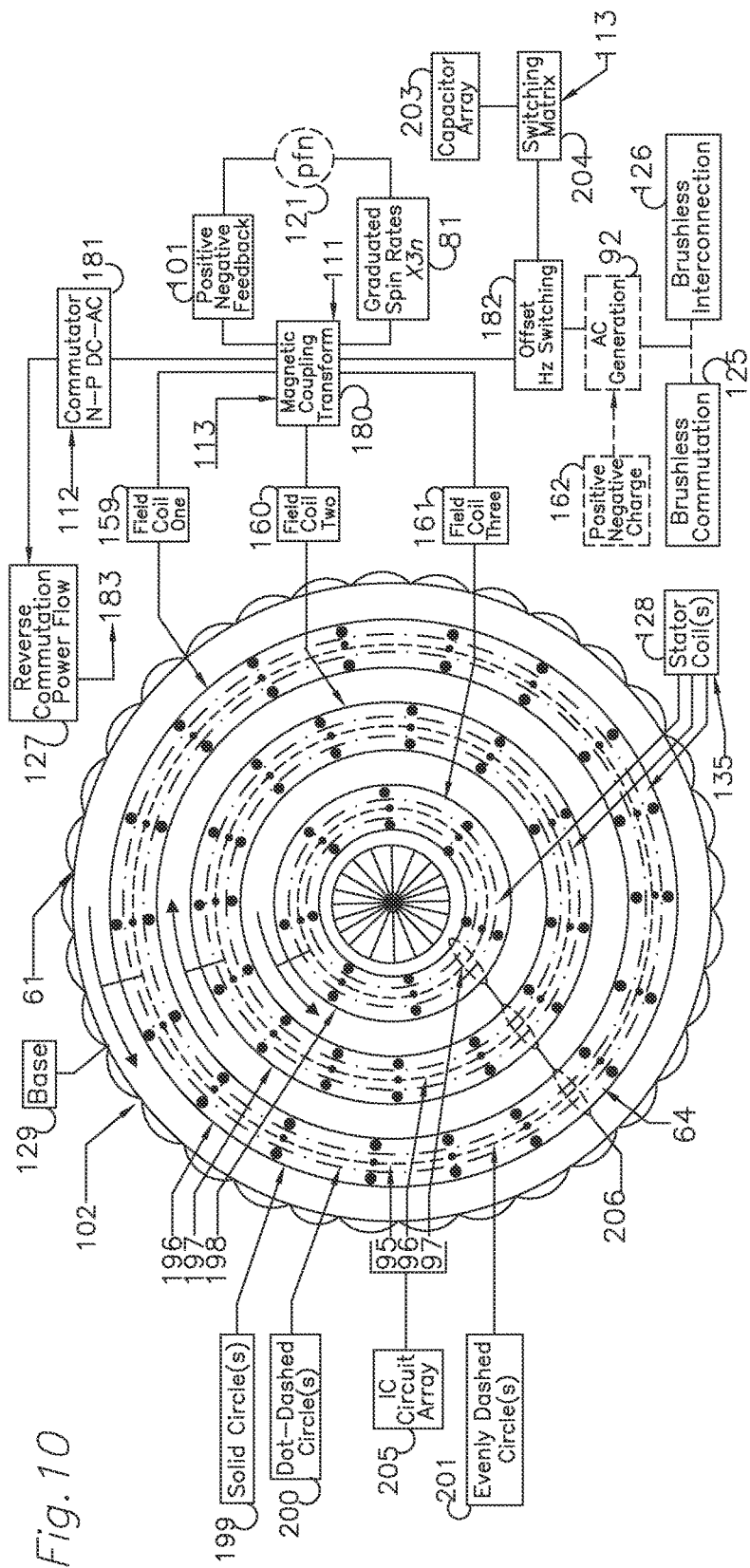
FIG. 10 depicts a top down view of the stator and cone-rotor relationships, according to and embodiment of the invention.

Referring to FIG. 10, depicted here is a simple top-down view of truncated cone-rotors as they rotate around and within each stator coil. Referring to FIG. 9, and FIG. 10, the solid circle(s) 199 depict the outer circular borders of each concave stator coil(s) 196, 197 and 198. The dot-dashed circle(s) 200 depict the inner circular borders of the concave stator coils 128. The evenly-dashed circles(s) 201 depict the cone-rotors 53, 54 and 55 and cone-rotor skirts 95, 96 and 97. Close spatial clearance 208 is important. A close spacing between cone-rotors and light guide elements, and between cone-skirts and stator borders provides optimum performance. Maglev performance is achieved at the bottom 175 of the cone-rotor(s) and respective cone-skirts and the maglev effect that is generated at the top of each cone-rotor where maglev track 59 and the maglev guide 62 reside.

The Fresnel ribbing spreads Sunlight, incident light, and heat to each nested "Russian Doll" fitted cone-rotor. The cone-rotors each have concentric but differing circular base diameters and are accordingly coupled at their apexes to the column at different vertical heights of the column so that the rotors are stacked adjacent to each other in a the same manner as Russian Dolls are closely stacked. This accumulated light and heat effect produces an aggregate assemblage of electrical voltage which results in an exponential increase of electrical energy generation. Embodiments of the invention also utilize the heat that is magnified by the outer optical lens concentrator and the aggregate assemblage of fused and faceted Fresnel ribbing to produce electrical energy.

Referring to FIG. 7, depicted here is a single Spin 3D power generation system 50. In this drawing heat management means and methods are disclosed. Embodiments of the invention also fully exploit the potential energy that is generated from Sunlight and magnified by the disclosed Fresnel outer optical lens enclosure and the aggregate assemblage of layered Fresnel ribbing. Each Spin 3D power generation unit has an integrally fitted heat sink system. The heat sink system is comprised of a circular and finned cooling heat sink array 86, that is designed and manufactured with an integral conical shaped and finned heat sink body 145. Cone-rotor three is fitted and rotates over the conical heat sink 145. This is a logical design feature, since heat will be concentrated to the center of the Spin 3D power generation device.

With the exception of the outer lens optical concentrator 61 and the heat sink cooling array, all other key device surfaces spin. There is induced, due to the inherent spin effect of the invention's components, an effective temperature cooling effect. Additionally, the Sun travels in an azimuth around the Spin 3D power generation device during a solar day, resulting in an even distribution of heat over the cone and elimination of any hot spots. Heat 88 from the Sunlight propagates towards the exposed surface of the conical surfaces and naturally convects through the device and propagates towards the opposite side of the conical surface 188. The aggregate effect of the spinning cone-rotor surfaces also adds significantly to the overall cooling of the device. The conical geometric shape of both mobile and stationary surfaces adds significantly to the cooling effect because heat is concentrated at the top of the Spin 3D power generating device. Heat and air circulate in an ellipsoidal flow 134 and a combined hemispherical flow 133 pattern.

There are certain practical feature sets that are needed for practical installations of the spin 3D photovoltaic cell 3D power generation apparatus. There is a snap on pointed cap that prevents birds from perching 191 on the top of the outer optical lens concentrator. The surface of the outer optical lens cover is also coated with a non-stick film that enables easy maintenance such as washing off dirt and other matter.

Referring to FIG. 3 and FIG. 7, the embodiment utilizes thermo-electric circuitry 147 and 147a. This design includes a Peltier circuit 136 and 136a. The embodiment utilizes the increased DC voltage output 148 produced by this circuitry and returns it to the device's circuitry means that produce AC voltage current 149 and direct DC voltage output. Selected thermo-electric generation and Peltier circuits are well known to those who practice the arts. However, the embodiment utilizes these means and methods in a unique and novel manner. In FIG. 8, brushless commutation 125 and brushless interconnections that enable efficient DC to AC conversion also dramatically improve heat dispersion due to the elimination of friction. This fact also lends dramatically to increased Spin 3D power generation efficiency and systemic longevity.

Figure 4:
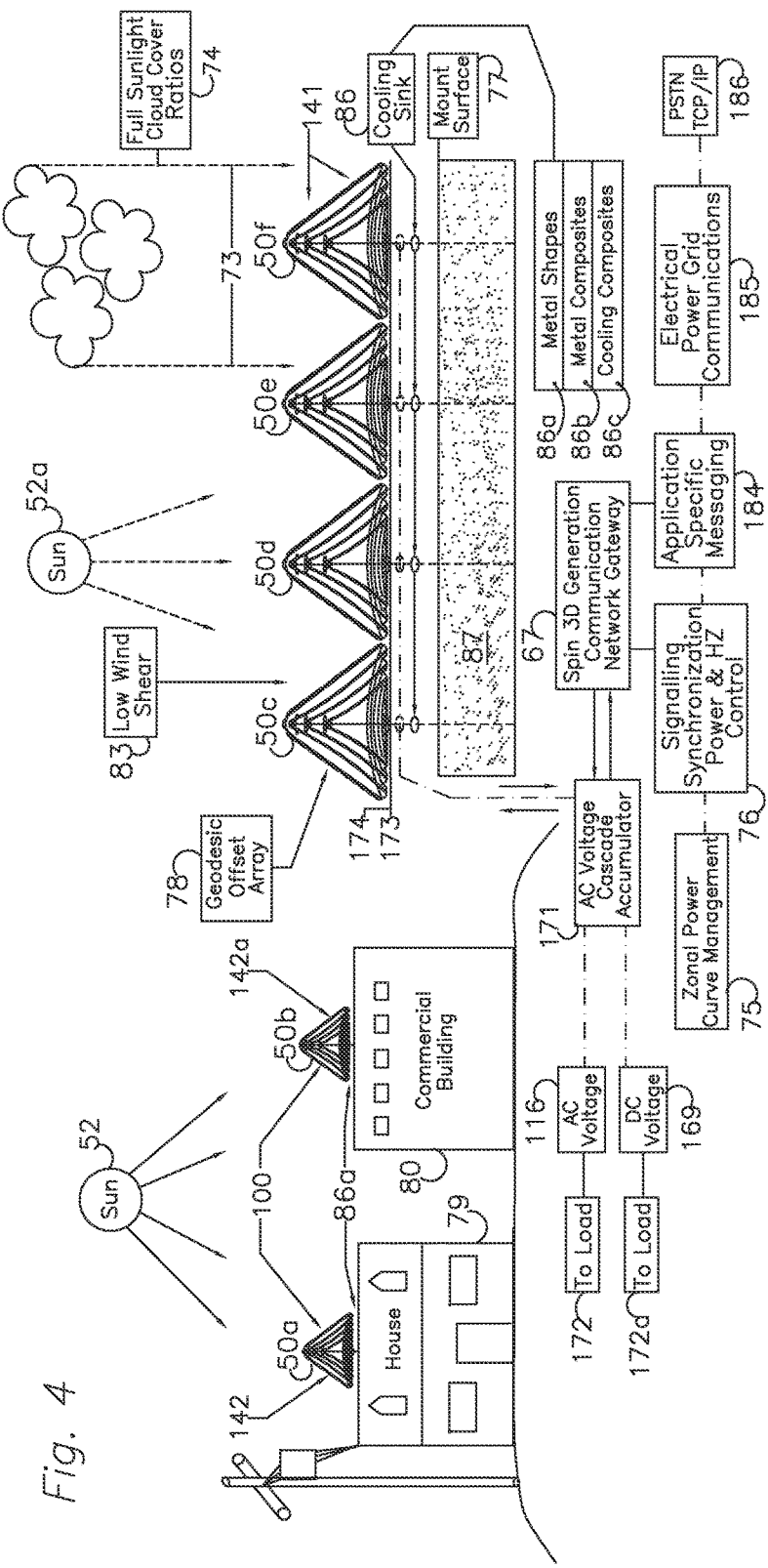
FIG. 4 depicts a plurality of practical installations of the Spin 3D power generation system, according to an embodiment of the invention.

Referring to FIG. 4, the embodiment is designed to serve as a single Spin 3D power generation system unit 50a, and 50b if so desired. Each installed Spin 3D power generation system is a self-contained standalone solar power electrical power generating system in this case. A single Spin 3D power generation system provides DC and AC voltage for off the grid applications. Storage batteries that require DC power for charging or for DC powered light emitting diode (LED) lighting, billboard advertising signs, road safety signs, roadway emergency call boxes, traffic signal systems, emergency lighting, security systems, mobile cellular base site back up power systems, communication systems for petrol stations, and any other DC powered systems, will be powered by the Spin 3D power generation system.

A single Spin 3D power generation system unit also provides AC electrical voltage that powers any electrical powered apparatus and appliance that requires alternating current. Each Spin 3D power generation system solar power system is completely scalable. A large scale single Spin 3D power generation system might be designed and manufactured many feet or meters tall. Smaller spin 3D power generation units may measure only inches or centimeters in size. Size and scale directly equates to how much power is desired for a particular application.

The embodiment's size and power output design parameters are driven by market demand and site-dictated dimensional requirements. Therefore the embodiment is designed to be manufactured and deployed in a myriad of ways. However, each application specific apparatus is designed with the lowest cost that derives the best efficiency dollar for dollar when compared to any other legacy solar photovoltaic system. For example, the embodiment can be installed and operated on top of a large building or on a large parcel of land such as the depicted large commercial grid 141 as shown in FIG. 4, or on the balcony of a large apartment building.

For example in FIG. 4, a single Spin 3D power generation system unit provides electrical power for commercial building(s) 80, a residential structure such as an apartment building, and single family dwelling such as a standalone house 79. The geometric design of each Spin 3D power generation system minimizes the deleterious effects of wind load. The design inherently minimizes wind shear 83. Another feature according to one embodiment of the invention is that due to the specialized geometric shape of each Spin 3D power generation system, full exposure of the Sun 52, 52a is insured. In this particular application-specific case the preferred shape is conical.

A standalone Spin 3D power generation system for on-grid deployments can be easily interconnected and utilized by a local, regional or national electrical power grid network. The embodiment is also ideal for small off grid and or private electrical power grid 142 topologies as shown in FIG. 4. However in still another application environment, an entire multi-unit Spin 3D power generation system array 141 is shown. Depicted here are four physically and logically linked Spin 3D power generation systems 50c, 50d, 50e and 50f.

In a typical large Spin 3D power generation system unit array there may be hundreds of physically and logically linked units. In this case a multi cell array is best deployed and installed in a geodesic offset array 78 in order that all Spin 3D power generation system units have access to full coverage by the Sun 52, 52a during the horizon-to-horizon travel path that occurs in a typical solar day. In a large Spin 3D power generation system array, each unit is mounted 77 on the Earth 87 as a stable surface.

Referring to FIG. 4, a plurality of physically and logically linked Spin 3D power generation system units produce DC voltage from the individually linked trigonal photovoltaic cells that are arrayed in each internal Spin 3D power generation system cone-rotor. Each trigonal PV cell is physically wired in a cascading circuit to individual magnets that are placed evenly around the circumference of each nested "Russian Doll", and/or hierarchical scaled cone-rotor that resides with each Spin 3D power generation system 50c, 50d, 50e and 50f arrayed here. The DC positive-negative power that is generated from each trigonal PV cell and section flows down to the magnets located within each cone-rotor skirt. Each individual trigonal PV cell is connected to two dedicated magnets. Each magnet is switchable between positive and negative polarities. The embodiment's directly wired circuits are terminated by the circuit array of special integrated circuits (IC) and diodes that are evenly distributed at the bottom or skirt of each cone-rotor.

This even-distribution means and method maintains balance and cone-rotor spin-gyro accuracy in order that sustained and predictive high quality alternating current (AC) is generated as a result of well managed spin. As the cone-rotor spins its array of charged skirt magnets, the magnets interact by way of the projected magnetic flux field with each base-mounted toroidal coil which comprises a concentrically wired and physically arrayed tri-coil stator. Each stator is wired in a toroidal coiled pattern within the physical structure of each magnetic stator 174 located at the bottom or base 173 of each cone, evenly arrayed in plurality within the physical structure of the Spin 3D power generation system base.

In still another embodiment, a multiple array of Spin 3D power generation systems generate electrical voltage independently, while at the same time, each Spin 3D power generation system unit is physically and logically linked together as previously disclosed.

Conventional flat panel PV areas are highly inefficient in many ways. However, one particular problem that plagues flat panels and other conventionally linked PV cells is completely solved by the means and methods of the embodiment. When a conventional flat panel is exposed fully to the Sun 52a, all PV cells in the array generate maximum DC voltage only when the array is aligned at a particular peak angle. The embodiment is constantly at peak power angle because of geometric shape and by virtue of its essential spin. During a solar day, quite often there is intermittent cloud cover. Once clouds obscure part of a conventional flat panel, a portion of the series-circuit linked cells lose the ability to generate full power at momentary peak angle. This deleterious effect also places a load drain upon other adjacent cells that reside within the flat panel array, causing the array to lose power. The embodiment fully solves this problem in a unique and novel way. The embodiment enables full power when all exposed trigonal PV sections are exposed to the Sun during a cone-rotor rotational event. By virtue of the unique wiring and circuit design, the trigonal PV sections that populate those cone-rotors that are not momentarily exposed to Sunlight or any light source do not drain power from the exposed trigonal PV sections. In FIG. 4, this beneficial feature is defined here as zonal power curve management 75.

In FIG. 4, the embodiment provides for an effective and low cost cooling sink system 86. Each Spin 3D power generation system unit has its own cooling sink that is comprised of selected metal shapes 86a, metal composites 86b, that are designed to be the most effective cooling composites 86c.

A plurality of installed Spin 3D power generation system units are also synchronized in power and in frequency by an efficient central controller. The embodiments described above fully enable efficient AC voltage 116 and DC voltage 169 production that are produced from the embodiment's efficient and low cost AC voltage-cascading accumulator, ensuring efficient generation of the electrical power that is in demand from load sources 172 and 172a.

Referring to FIG. 4 and FIG. 2, a complete multi-unit-Spin 3D power generation system is physically and logically linked with a metallic, composite and/or optical communications network topology. An entire Spin 3D multi-unit array is controlled by a low cost and efficient switch management system and network communication gateway 67 that is combined and located with the AC voltage cascade accumulator 171. Embedded in the digital communication language are cone-rotor synchronization and control messaging. The embodiment provides digital telemetry and synchronization control of all three cone-rotors in one spin cell power generation system, and provides control for a plurality of spin cell power generation systems that are installed in a spin cell power generation network such as a large array in a desert.

The interaction of each cone-rotor and associated concentrically segmented toroidal coil also provides the ability to transmit digital control language 89 for (1) synchronization and (2) control messaging to and from each Spin 3D power generation apparatus. In FIG. 2, the digital control language 89 is a feature used to optimize individual cone-rotor spin rates in order to glean the optimum amount of electrical power output from the entire Spin 3D power generation array, comprised of a plurality of Spin 3D power generation units, 50c, 50d, 50e, and 50f regardless of partial cloud cover and the like.

Referring to FIG. 1, here is depicted three photovoltaic cone-rotors, set and overlaid in nesting "Russian Doll", or hierarchical scale arrays. In this case, cone-rotor one 53, cone-rotor two 54, and cone-rotor three 55 are fitted on a graduated axle-needle bearing 60 that is mounted in the vertical plane. The axle 60 is connected to a horizontal base that is comprised of sturdy composite non-conductive material. This specially designed base contains the embodiment's concentric toroidal three ring coil, shown here as a concave stator structure 66 triad comprised of concave coil one 138, concave coil two 139, and concave coil three 140 respectively.

Cone-rotor to stator magnetic levitation, Maglev, or magnetic suspension is a method by which an object is suspended with no support other than by induced magnetic fields. This feature set enables cone-rotor(s) support which imposes little load on the embodiment's Maglev float-bearing race design holding each cone-rotor on the graduated needle-bearing axle assembly as it spins. Magnetic levitation is used for Maglev trains and for magnetic bearings that have minimal friction effects. In this way the embodiment enables incredible levels of efficiency and systemic longevity. These features add to overall reliability and to low maintenance costs for the Spin 3D solar electrical power generation system.

Each cone-rotor spins. Cone-rotor one 53 spins 56, cone-rotor two 54 counter-spins 57 in relation to the spin trajectory of cone-rotor one 53, and cone-rotor three 55 counter spins 58 in relation to the spin trajectory of cone-rotor two 54. Each cone-rotor is comprised of photovoltaic cell layers 51 that are cut, assembled, and fused in a trigonal gossamer structure 110 as depicted in FIG. 5. Each trigonal structure comprises the physical apparatus of each cone-rotor structure. Each cone-rotor trigonal gossamer structure 110 is designed to be fused in faceted photovoltaic optical offsets. In this way, the optical effect of this offset parameter gleans more energy from the received energy. Referring to FIG. 1, the axle 60 is designed and manufactured in a graduated-three-tiered level architecture. Each tiered level supports a needle float bearing Maglev bearing structure. Each tiered structure supports three bearings, three bearing races, and three cone-rotor stabilizer(s) 62.

The axle 60 also acts as an effective heat sink and a cooling path that travels to conical 131 and combined circular 132 heat sink array 86 as depicted in FIG. 7. The heat sink-to-cooling sink 132 device is located at the bottom of the Spin 3D power generation system 50 below the concave stator structure 66 that contain the specially designed stator coil(s) 128 as depicted in both FIG. 3 and FIG. 7. In FIG. 1, heat 88 and light from the Sun 52 propagates through the outer optical lens concentrator 61 to and through photovoltaic cone rotor one 53, photovoltaic cone rotor two 54, and photovoltaic cone rotor three 55. Each cone rotor counter spins 56, 57, and 58. The middle or cone rotor two 54 counter spins 57 in relation to cone rotor one 53 and cone rotor three 55 for the purpose of inducing (a) an accelerated flash spin rate 69, 69a, and 69b respectively in FIG. 2. Due to the spin effect of the embodiment's photovoltaic surfaces the Sun bore sight is an optical collimator aperture no matter which position the Sun is in at any given time of day.

Referring to FIG. 2, according to one embodiment of the invention, a dynamic flash-spin-rate (FSR), or a dynamic rotational Frame Scan Rate, (FSR) periodic aperture provides (1) a photoelectric effect, (2) also known as dynamic shutter effect 150. This shutter effect is well known in the cinematic technological arts and is fully exploited for the embodiment's dynamic photovoltaic effect, a type of Sunlight power store-and-forward effect as the embodiment's photovoltaic sections and individual trigonal shaped photovoltaic cells that comprise the invention's total Spin 3D.

This dynamic shutter-aperture process is an additive effect that is like a waterwheel filling other water wheels. This photo-electric effect is an electro-mechanical action resulting in an exponential increase of electrical power production as a result of an electromagnetic cascading effect. This beneficial effect is gleaned from the same surface area in a cone-rotor cell-to-cell when compared with a conventional static flat-panel array when both photovoltaic surfaces are comprised of that same PV material, such as monocrystalline silicon, polycrystalline silicon, amorphous silicon, cadmium telluride, or copper indium selenide-sulfide. This cell-to-cell comparison also includes transparent thin film photovoltaic material, painted dye photovoltaic material, etched aluminum material, and the like. The embodiment enables a four-to-one increase. This accrued result is a conservative real world mathematical measure.

A simplified structure that is only comprised of one spin cone-rotor photovoltaic surface is sufficient to demonstrate this increase in performance over conventional flat photovoltaic panels. The next level of development includes the assemblage of a plurality of hierarchical placed cone-rotors. This embodiment is also combined with proper heat sink structures. The embodiment's use of heat sink structures are designed to return voltage to the overall aggregate assemblage of electrical voltage output, and directly contributes to the overall effective cascading methodology.

The embodiment in its fully developed form uses Peltier-effect circuits, and thermo-cooling heat sink structures along with simple low-cost electrical circuits that will significantly increase overall systemic performance. These circuits are comprised of robust and low cost diodes, integrated circuit (IC) switching chips, and other electrical devices that are well known to those who practice the arts. However, the embodiment clearly utilizes Peltier circuit arrays and thermo-cooling circuit structures in a completely novel way. Additionally, on cold overcast days the embodiment provides the circuitry means and methods to glean voltage from lower environmental temperatures.

As the embodiment's prototypal constructs are further advanced it is envisioned that the aggregate electrical power output will be exponentially increased along with other to-be-disclosed embodiments. The embodiment in another or syntaxial point of view takes best advantage of the spinning quantum-photo electric effect. The spinning photovoltaic structure absorbs an exponentially increased light-to-voltage photon-quanta, simply due to the cone-rotor spin effect.

Referring to FIG. 6, the embodiment's photo electric conversion process occurs with the spin advance of photovoltaic sections as they pass from horizon-to-horizon within the scope of the Sun's 52 light and heat 88. This technical construct directly correlates spin cell horizon-to-horizon light exposure with respect to travel of the Sun. As the Sun advances across the exposed face of the spin cell(s) surface, the target area photovoltaic output has a rise-and-fall slope that can be measured and tracked as the spin cell advances, and can be used to sustain high power output directionality, throughout the solar day.

This novel phenomenon is easily measured by simple low cost circuitry. This logical circuit flow sets up a sustained peak-slope-to-decay-advance duration-criteria that is coupled with respect to exposure to light from the Sun as it tracks. A simple tracking system based upon a tried and true Hall-effect can be utilized. This simple electro mechanical effect is due to the spin of the first and last PV sections on the PV spin surface, by photon gain and by photon decay measured as a function of PV section voltage decay; i.e., shutter effect as the Sun passes over in a given arbitrary measure of time.

In this case, it is simply a matter of tracking and measuring voltage peaks and troughs that occur when voltage slope is monitored. The cone-rotor spin effect dynamic introduces an optical, photo-electric, and periodic interval-differential 118. This sets the criteria for an exponential increase in electrical generation as a result of the optical dynamic shutter effect 150, physically defined by the horizon edge 152 to horizon edge 152a increment in the same way that is defined by the Sun's boresight 151, which is the directional effect of Sun's light and heat.

This relates to how selected satellite radio antennas follow the center bore-sight of received radio wave signal strength from satellite transmitters as these traveling objects advance across the sky. This technology goes back to the 1960's. In another way of stating this concept, consider photons, also known as quantum units, that strike the spinning surface from horizon to horizon as the spinning photovoltaic cone detects light-to-dark transitions, another function of the optical-photo-electric dynamic shutter effect. This can occur as a 180 degree point-to-point effect that maintains the overall apparatus focal point at an accurate angle of full light incidence detection. This is a simple center slope measurement of Sunlight and application of power feedback, and can be used for electro mechanical control. This can be a simple rotor-to-stator voltage-magnetism detection effect that does not reduce power from the total spin array output.

Referring to FIG. 3, this illustration depicts the concentric three ring stator coil platform, toroidal coil array. 360° magnetic gradient with respect to the three ring concentric stator coil(s) 128 and the single skirt magnet 117 as depicted in FIG. 6. Each single cone skirt magnet has a phase offset parameter that is simply defined here as a dynamic polarity magnetic gradient which is switchable with respect to the 360° degree magnetic gradient 122 of relative rotational position 122a of each photovoltaic spin surfaces that are depicted in the embodied drawings as Spin 3D cone cells as such.

The concept of placing more spin cells that produce much more power per amount of installed area, such as a roof of a building or a natural earth surface, must be exploited. The Penumbra effect is fully exploited to glean maximum energy from horizon-to-horizon. Horizon-to-horizon in this case can be construed in terms of clockwise and counter-clockwise relative directional spin as referenced by viewing the cone-rotors from a top-down perspective.

This directional spin effect creates a dynamic optical shutter effect, which is coupled with the Fresnel effect. This technical fact has been proven in radio communication with satellites used in both the Russian and U.S. space programs since the 1960's. This feature of the specification represents a massive potential increase in output. This feature has as yet never been tested and confirmed, and has never been applied in this manner. Proper understanding of the behavior of quantum units of light called photons allows for the introduction of a new paradigm of measuring how these photons excite the surface of the PV material of choice in a spin state. A revolution in fact is established, based upon a use the dynamic shutter effect 150 as specified in FIG. 2, according to an embodiment of the invention.

As shown in FIG. 2, this unique design also provides gyro stability, and enhanced cooling for each cell and for the entire device. The embodiment provides a uniquely designed heat sink. A heat sink is an object that transfers thermal energy from a high temperature medium to a lower temperature medium. In the case of the embodiment, in FIG. 1 the medium is the contained and isolated air 143 and/or selected gas 144 that resides (a) within the sealed Spin 3D power generation system apparatus and/or (b) external air that exists in the common atmosphere that circulates around the outside of the optical lens concentrator 61. The embodied apparatus provides an internal axle 60 and integrally connected internal 145 conical shaped heat sink that are physically connected to the external 146 heat sink that transfers heat from inside the Spin 3D photovoltaic device to an outside heat sink that is mounted underneath the Spin 3D photovoltaic device.

Referring to FIG. 7, the embodiment fully exploits Peltier effect thermoelectric-cooling, shown as 147a, and by providing an embedded Peltier circuit 136 as shown in FIG. 3 and FIG. 7 respectively. The embodiment also creates a heat flux from the direction of the Sun's 52 light, and heat 88 through a cooling path from the axle 60 to the top faceted heat sink 137 and the internal finned conical heat sink 145 that is physically and logically fused with the circular finned heat sink 146 that resides at the bottom of the entire dynamic solar photovoltaic apparatus defined here as the Spin 3D power generation system 50 to combine a heat dispersing system and a thermoelectric energy generating system according to an embodiment of the invention. However, these heat management and electrical generating methods are based upon separate conventional thermal electrical means and methods.

The received heat currents propagate from heat source to the heat sink located at the dark side of the spin cell and the bottom of the apparatus enclosure. In still another point of view, the Spin 3D power generation system with its spinning vortational photovoltaic surfaces create and sustain a hemispherical and simultaneous ellipsoidal flow of accumulated heat currents. These heat currents are directed towards the bottom of the Spin 3D power generation system apparatus container. The bottom of the Spin 3D power generation system apparatus is a uniquely designed and provided heat sink that is coupled with a non-mechanical yet dynamic design as disclosed.

The embodiment's inherent form factor enables efficient cooling. This form factor takes the combined form of (a) flat circular cooling fins and (b) conical cooling fins with multiple heat paths created by the three dimensional spin-motion of each layered conical photovoltaic surface within the enclosure that also serves a specially designed outer optical lens 61 that focuses light and heat to each rotating photovoltaic surface.

The Spin 3D power generation system is always facing the Sun in 180° degree elevation and azimuth alignment of conical photovoltaic surface exposure as it spins in a 360° degree rotational dynamic vector. Received sunlight directionality 63 is shown in FIG. 7. One or a plurality of photovoltaic cones is provided in a nesting "Russian Doll", or hierarchical scale array. Each cone spins on a central axle 60. In some application specific cases the embodiment is designed to generate electrical voltage as one standalone spinning photovoltaic surface that is fitted inside the outer optical and lens concentrator 61. A conical surface shape is but one of a plurality of geometrical shapes that are possible as a preferred embodiment.

The center axle can be comprised of a number of metallic or non-metallic composite materials that also acts as cooling sink. Depicted in FIG. 7 is an outer optical lens concentrator 61. The optical concentrator can be manufactured in a myriad of ways. The preferred material in this case is injection molded or spun clear acrylic material. Acrylic material tends to have properties that lend to sustained transparency when exposed to sunlight and withstand the deleterious effects of wind and sand erosion. Due to spin and light concentrators, each spin cell conical section that is comprised of crystalline substrate is constantly positioned at peak photovoltaic energy angle. In one embodiment of the invention, heat flow out of the system is caused by thermal convection streams that are created by novel shapes on the rotating spin voltaic surfaces.

Due to the discovery of a new electro-magnetic field effect called electron flipping 64, the embodiment introduces a distinct game change in the world of solar-photovoltaic technology. The embodiment completely exploits the Sun as an optical collimating focal plane in direct optical relationship to the Spin 3D power generation system's photovoltaic cone-rotors and the inherent dynamic shutter effect that results from this relationship. Referring to FIG. 7, the embodiment simultaneously generates direct current (DC) and alternating current (AC) in the same integral device.

The Spin 3D power generation system is a dynamic electrical generation system, whereas a conventional photovoltaic flat panel is a static solar electrical-power generating system.

Additional objects and advantages will readily occur to those skilled in the art. The embodiment in its broader aspects is not limited to the specific details, methods, representative devices, and illustrative examples shown and described. Accordingly, departures may be made from such details without departing from the spirit or scope of the general inventive concept as defined by the appended claims and their equivalents. The examples provided herein are illustrative only, and are in no way meant to limit the embodiment.

What is claimed is:

1. A solar power generation apparatus, comprising:
   a stationary horizontal base comprising a stator housing three concentric toroidal coils;
   a vertical column fixedly coupled to the base;
   an inner, middle, and outer conical-shaped rotor, each rotatingly coupled at its apex to the column, each rotor rotating independently of the other rotors about a vertical axis, each rotor having a base concentric with respect to the other rotors and proximate to a respective one of the three concentric toroidal coils, each rotor comprising: an array of photovoltaic cells positioned on a surface of the rotor, wherein each photovoltaic cell converts light energy received from a light source to a direct current voltage; and
   pairs of magnets positioned at a perimeter of the base of the rotor, wherein each pair of magnets is electrically coupled to, and receives direct current voltage from, a respective photovoltaic cell;
   wherein the rotating of each rotor converts the direct current voltage present at the respective pairs of magnets into an alternating current voltage; and
   a conical shaped transparent array of optical concentrators positioned outside the outer rotor; to concentrate the light source to the array of photovoltaic cells.

2. The apparatus of claim 1, wherein the vertical column fixedly coupled to the base comprises a center axle, and wherein each rotor is coupled at its apex to the center axle.

3. The apparatus of claim 1, wherein the photovoltaic cells comprise trigonal segments of photovoltaic material.

4. The apparatus of claim 1, wherein each pair of magnets is electrically coupled to, and receives direct current voltage from, a respective cell, by way of a transparent electrical conductor coated on the surface of the rotor.

5. The apparatus of claim 1, wherein the conical shaped transparent array of optical concentrators comprises a Fresnel lens.

6. The apparatus of claim 1, wherein each rotor rotates in a different direction than an adjacent rotor.

7. The apparatus of claim 6, wherein the middle rotor rotates in a different direction than the inner and outer rotors.

8. The apparatus of claim 1 further comprising at least one rotor rotating at a different rate than another rotor.

9. The apparatus of claim 1, wherein the inner rotor rotates in a different direction than the middle rotor, and the middle rotor rotates in a different direction than the outer rotor, to convert the direct current voltage into an alternating current voltage.

* * * * *